United States Patent
Yang et al.

(10) Patent No.: US 11,690,222 B2
(45) Date of Patent: Jun. 27, 2023

(54) THREE-DIMENSIONAL MEMORY DEVICE

(71) Applicant: MACRONIX INTERNATIONAL CO., LTD., Hsinchu (TW)

(72) Inventors: Chih-Kai Yang, Kaohsiung (TW); Tzung-Ting Han, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 337 days.

(21) Appl. No.: 17/102,576

(22) Filed: Nov. 24, 2020

(65) Prior Publication Data
US 2022/0165747 A1 May 26, 2022

(51) Int. Cl.
*H01L 27/11582* (2017.01)
*H10B 43/27* (2023.01)
*H10B 43/10* (2023.01)

(52) U.S. Cl.
CPC ............ *H10B 43/27* (2023.02); *H10B 43/10* (2023.02)

(58) Field of Classification Search
CPC ......... H01L 27/11551; H01L 27/11556; H01L 27/11578; H01L 27/11582; H10B 43/27; H10B 43/20
See application file for complete search history.

(56) References Cited

U.S. PATENT DOCUMENTS

| | | | |
|---|---|---|---|
| 2017/0069645 A1* | 3/2017 | Kubota | .................. H01L 29/495 |
| 2017/0256559 A1 | 9/2017 | Yoon et al. | |
| 2018/0323206 A1 | 11/2018 | Seo | |
| 2019/0287985 A1* | 9/2019 | Shimojo | ................ H10B 43/35 |

* cited by examiner

*Primary Examiner* — Christopher A Johnson
(74) *Attorney, Agent, or Firm* — McClure, Qualey & Rodack, LLP

(57) ABSTRACT

A three-dimensional memory device and a method of manufacturing a three-dimensional memory device are provided. The method includes providing a precursor structure including a substrate, a multi-layered stack, a plurality of vertical channel pillars and a barrier structure. A first slit and a second slit are then formed in the multi-layered stack and the substrate along a first direction, in which the first slit and the second slit have a pitch between thereof, and the second slit cuts the barrier structure. A portion of the second insulating layers is then replaced with a plurality of conductive layers. A first slit structure and a second slit structure are then formed in the first slit and the second slit, in which the first slit structure and the second slit structure separate the vertical channel pillars in a second direction that is different from the first direction.

9 Claims, 21 Drawing Sheets

THREE-DIMENSIONAL MEMORY DEVICE

BACKGROUND

Field of Invention

The present invention relates to a memory device and a method of manufacturing the same. More particularly, the present invention relates to a three-dimensional (3D) memory device and a method of manufacturing the same.

Description of Related Art

A nonvolatile semiconductor memory device is typically designed to securely hold data even when power is lost or removed from the memory device. As the increasing of applications and functions required by the users, the trend for the memory devices pursues higher storage density and smaller cell size. To satisfy this requirement, designers have been looking for techniques to provide a 3D memory device with stacked multiple planes of memory cells.

However, as critical dimensions of devices in integrated circuits shrink to the limits of common memory cell technologies, how to achieve greater storage capacity within a smaller memory device without deteriorate its operation performance have become a challenge to the persons skilled in the art. Accordingly, there is a demand for an improved 3D memory device and the method for fabricating the same to obviate the drawbacks encountered from the prior art.

SUMMARY

In accordance with an aspect of the present disclosure, a method of manufacturing a three-dimensional memory device is provided. A precursor structure including a substrate, a multi-layered stack, a plurality of vertical channel pillars and a barrier structure is provided. A first slit and a second slit are then formed in the multi-layered stack and the substrate along a first direction. The first slit and the second slit have a pitch between thereof, and the second slit cuts the barrier structure. A portion of the second insulating layers is then replaced with a plurality of conductive layers. A first slit structure and a second slit structure are then formed in the first slit and the second slit. The first slit structure and the second slit structure separate the vertical channel pillars in a second direction that is different from the first direction.

In accordance with another aspect of the present disclosure, a three-dimensional memory device is provided. The three-dimensional memory device includes a substrate, a first multi-layered stack, a plurality of vertical channel pillars, a barrier structure, a first slit structure and a second slit structure. The substrate has an array area and a staircase area. The substrate includes a lower portion and an upper portion. The first multi-layered stack is disposed on the substrate. The first multi-layered stack includes a plurality of first insulating layers and a plurality of conductive layers arranged alternately. The plurality of vertical channel pillars are disposed in the first multi-layered stack and the array area of the substrate. The barrier structure is disposed in the first multi-layered stack and the staircase area of the substrate. The first slit structure and the second slit structure are disposed in the first multi-layered stack and the substrate along a first direction. The second slit structure is in contact with the barrier structure, and the first slit structure and the second slit structure collectively separate the vertical channel pillars in a second direction that is different from the first direction.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top view, FIG. 2B, FIG. 2C and FIG. 2D are cross-sectional views corresponding to FIG. 2A taken along the line B-B', line C-C' and line D-D' respectively, according to some embodiments of the present disclosure.

FIG. 3A is a top view, FIG. 3B, FIG. 3C and FIG. 3D are cross-sectional views corresponding to FIG. 3A taken along the line B-B', line C-C' and line D-D' respectively, according to some embodiments of the present disclosure.

FIG. 5A is a top view, FIG. 5B, FIG. 5C and FIG. 5D are cross-sectional views corresponding to FIG. 5A taken along the line B-B', line C-C' and line D-D' respectively, according to some embodiments of the present disclosure.

FIG. 6A is a top view, FIG. 6B, FIG. 6C and FIG. 6D are cross-sectional views corresponding to FIG. 6A taken along the line B-B', line C-C' and line D-D' respectively, according to some embodiments of the present disclosure.

FIG. 7A is a top view, FIG. 7B, FIG. 7C and FIG. 7D are cross-sectional views corresponding to FIG. 7A taken along the line B-B', line C-C' and line D-D' respectively, according to some embodiments of the present disclosure.

FIG. 8A is a top view, FIG. 8B, FIG. 8C and FIG. 8D are cross-sectional views corresponding to FIG. 8A taken along the line B-B', line C-C' and line D-D' respectively, according to some embodiments of the present disclosure.

FIG. 9A is a top view, FIG. 9B, FIG. 9C and FIG. 9D are cross-sectional views corresponding to FIG. 9A taken along the line B-B', line C-C' and line D-D' respectively, according to some embodiments of the present disclosure.

FIG. 10A is a top view, FIG. 10B, FIG. 10C and FIG. 10D are cross-sectional views corresponding to FIG. 10A taken along the line B-B', line C-C' and line D-D' respectively, according to some embodiments of the present disclosure.

FIG. 11A is a top view, FIG. 11B, FIG. 11C and FIG. 11D are cross-sectional views corresponding to FIG. 11A taken along the line B-B', line C-C' and line D-D' respectively, according to some embodiments of the present disclosure.

DETAILED DESCRIPTION

Figure 1:
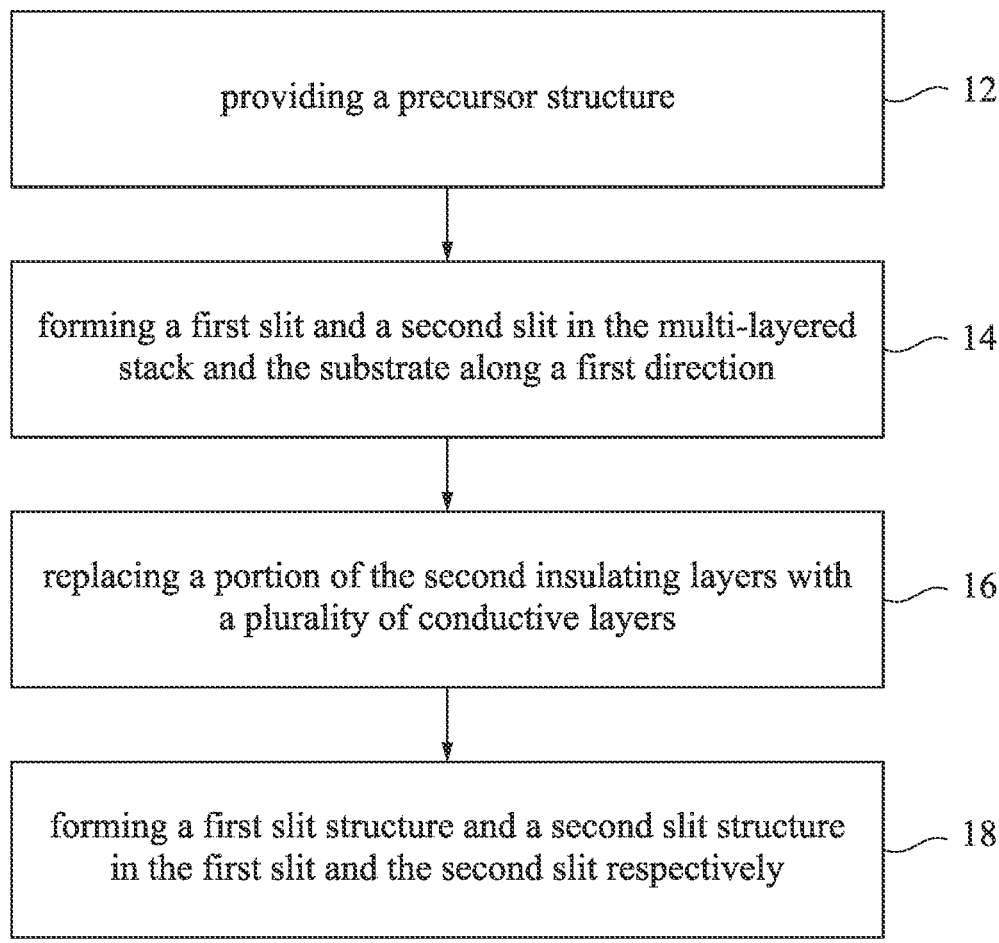
FIG. 1 is a flow chart illustrating a method of manufacturing a three-dimensional memory device in accordance with some embodiments of this disclosure.

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 is a flow chart illustrating a method of manufacturing a three-dimensional memory device in accordance with some embodiments of this disclosure. As shown in FIG. 1, the method 10 includes operation 12, operation 14, operation 16 and operation 18. It is noted that the method depicted in FIG. 1 is merely an example, and is not intended to limit the present invention. Accordingly, additional operations may be performed before, during, and/or after the method depicted in FIG. 1, and some other operations may only be briefly described herein.

Figure 2A:
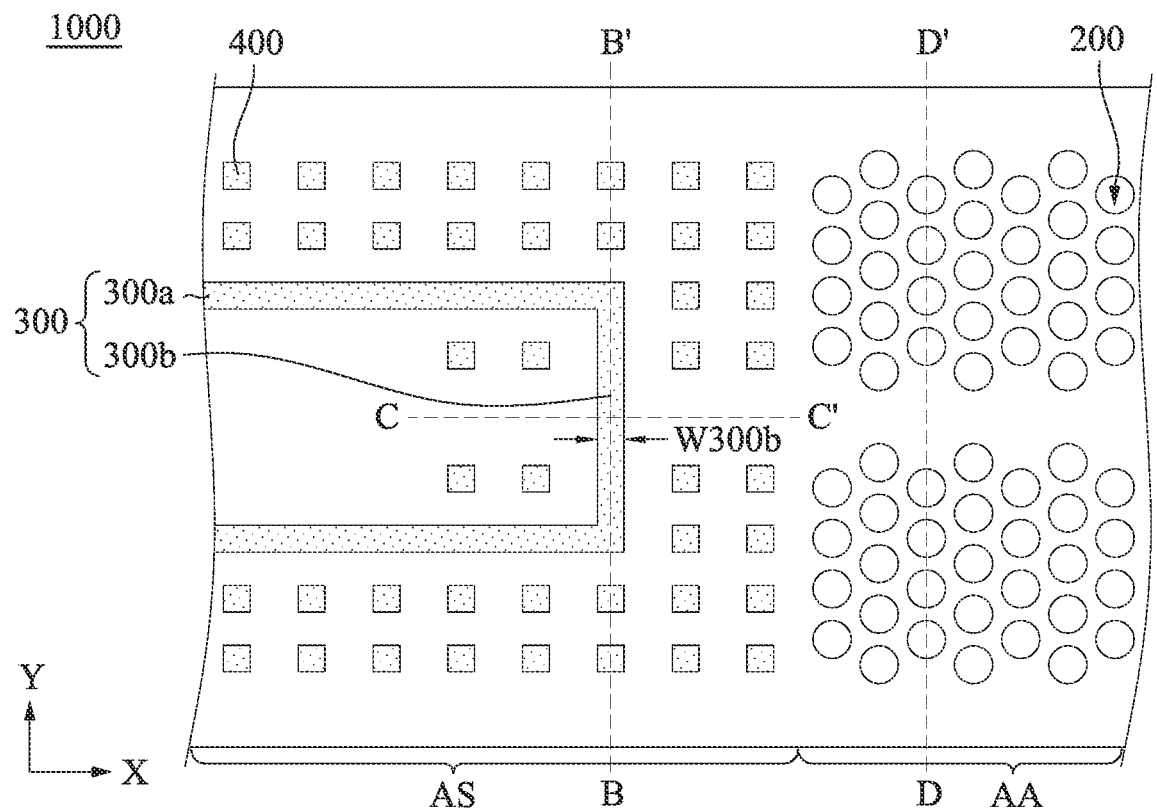
FIG. 2A to FIG. 2D show one of the various stages of manufacturing a three-dimensional memory device in accordance with some embodiments of the present disclosure.

In FIGS. 2A-11D, figures ending with an "A" designation are top views illustrating various stages of a method for forming a three-dimensional memory device according to some embodiments of the present disclosure, figures ending with an "B" designation are illustrated along reference cross-section B-B' illustrated in FIG. 2A, figures ending with a "C" designation are illustrated along a similar cross-section C-C' illustrated in FIG. 2A, and figures ending with a "D" designation are illustrated along a similar cross-section D-D' illustrated in FIG. 2A.

Figure 2B:
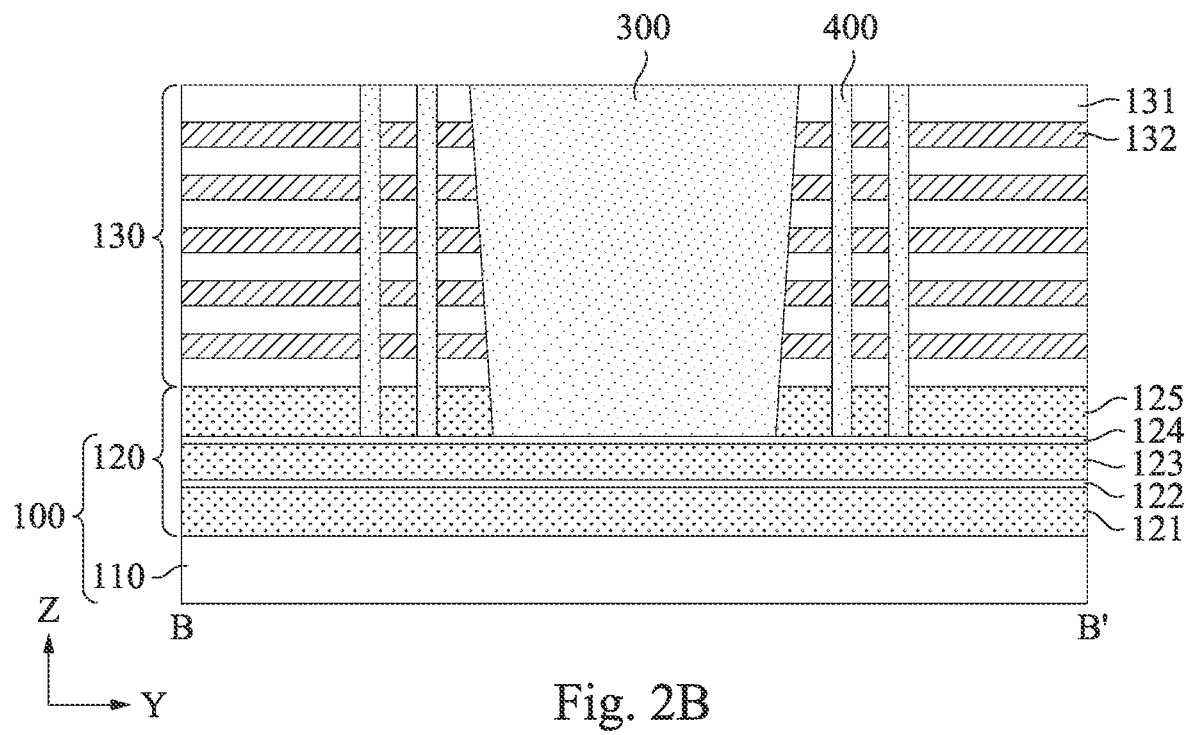

Reference is made to FIG. 1 and FIGS. 2A-2B. In the operation 12 of FIG. 1, a precursor structure 1000 is provided. The precursor structure 1000 includes a substrate 100, a multi-layered stack 130, a plurality of vertical channel pillars 200 and a barrier structure 300. The substrate 100 includes an array area AA and a staircase area AS. As shown in FIG. 2B, the substrate 100 may include a lower portion 110 and an upper portion 120. In some embodiments, the lower portion 110 of the substrate 100 may be semiconductor substrate, such as silicon containing substrate, but is not limited thereto. The upper portion 120 may include conductive layers 121, 123, 125 and insulating layers 122 and 124 arranged alternately along the Z-direction vertical to the substrate 100. In some embodiments, the conductive layers 121, 123, 125 may be polysilicon layer. In some embodiments, the insulating layers 122 and 124 may be oxide layer. In some embodiments, transistors, interconnect structures (not shown) are further formed in the substrate 100.

As shown in FIG. 2B, the multi-layered stack 130 is disposed on the substrate 100. The multi-layered stack 130 includes a plurality of first insulating layers 131 and a plurality of second insulating layers 132 arranged alternately. The material of the first insulating layers 131 is different from that of the second insulating layers 132. In some embodiments, the first insulating layers 131 include silicon oxide, but are not limited thereto. In some embodiments, the second insulating layers 132 include silicon nitride, but are not limited thereto.

Figure 2C:
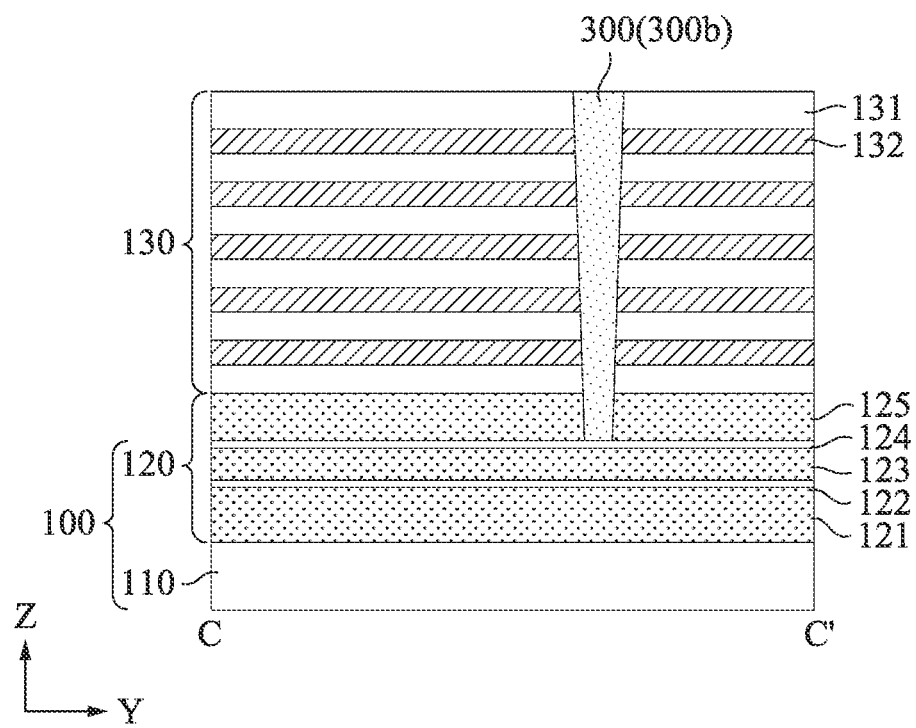

As shown in FIG. 2A and FIG. 2C, the barrier structure 300 is disposed in the multi-layered stack 130 and the staircase area AS of the substrate 100. A plurality of dielectric pillars 400 are also disposed in the multi-layered stack 130 and the staircase area AS of the substrate 100. The barrier structure 300 and the dielectric pillars 400 vertically penetrate the multi-layered stack 130 and extend into an upper position (e.g. conductive layer 125) of the upper portion 120 of the substrate 100. Specifically, the barrier structure 300 and the dielectric pillars 400 are in contact with the conductive layer 125 and the insulating layer 124 of the substrate 100. The barrier structure 300 includes a first portion 300a extending along X-direction and a second portion 300b extending along Y-direction. In some embodiments, the barrier structure 300 has a width W300b in the X-direction that is smaller than 100 nm.

In some embodiments, the barrier structure 300 is in a closed shape (e.g., a rectangle, a square, etc.) in the top view. In other embodiments, the barrier structure 300 is not in a closed shape in the top view. In some embodiments, some of the dielectric pillars 400 may be surrounded by the barrier structure 300, as illustrated in FIG. 2A. The barrier structure 300 may have an inclined sidewall, as illustrated in FIG. 2B and FIG. 2C. In some embodiments, the dielectric pillars 400 may be arranged in a row along the X-direction and the Y-direction. In some embodiments, the barrier structure 300 and the dielectric pillars 400 respectively includes silicon oxide, but is not limited thereto.

Figure 2D:
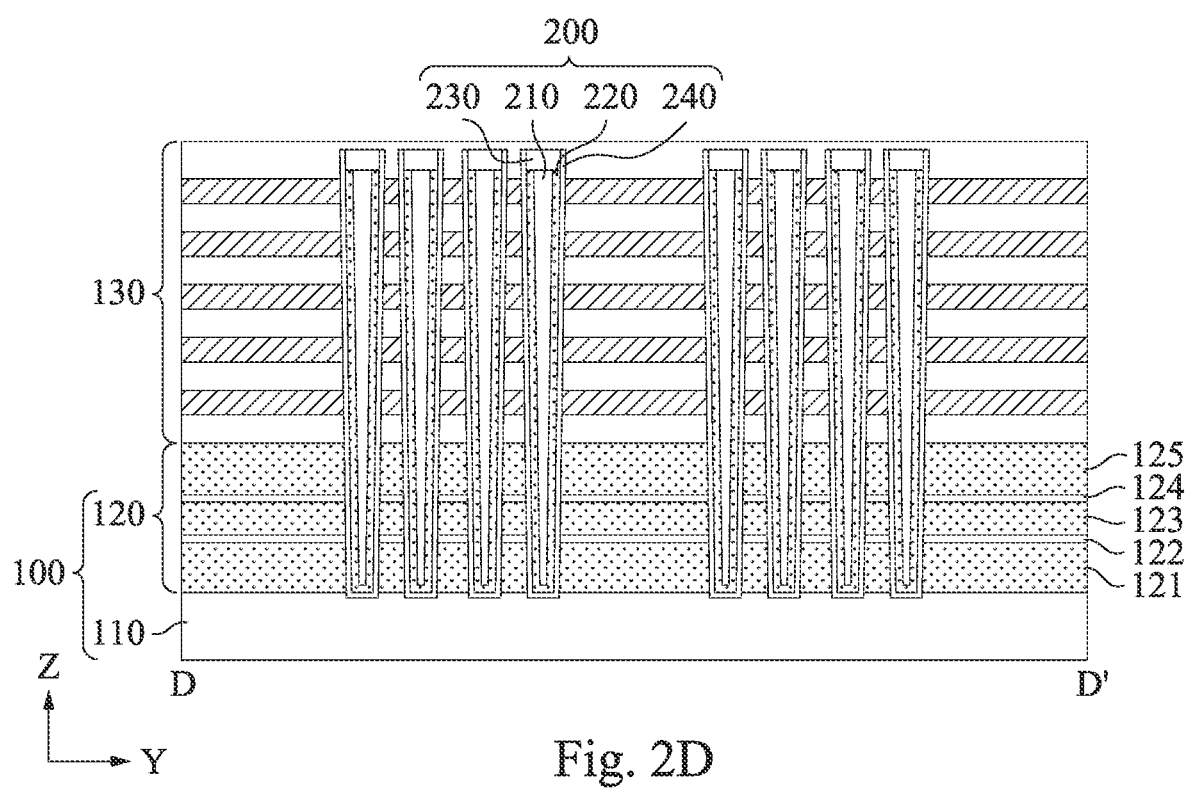

As shown in FIG. 2A and FIG. 2D, the vertical channel pillars 200 are disposed in the multi-layered stack 130 and the array area AA of the substrate 100. Each of the vertical channel pillars 200 includes an insulating pillar 210, a channel layer 220, a conductive plug 230 and a charge trapping layer 240. The insulating pillar 210 vertically penetrates the multi-layered stack 130 and extends into the conductive layer 121 of the substrate 100. In some embodiments, the insulating pillars 210 include silicon nitride, silicon oxide, silicon oxynitride, high-k material, or any combination of thereof. The channel layer 220 surrounds the insulating pillar 210. In some embodiments, the channel layer 220 includes polysilicon. The conductive plug 230 is disposed on the insulating pillar 210 and the channel layer 220. In some embodiments, the conductive plug 230 includes conductive material. In some example, the material of the conductive plug 230 is same as that of the channel layer 220. The charge trapping layer 240 is disposed between the channel layer 220 and the multi-layered stack 130. The charge trapping layer 240 may be formed of a composite layer including a silicon oxide layer, a silicon nitride layer, and a silicon oxide layer (i.e., an ONO structure).

Figure 3A:
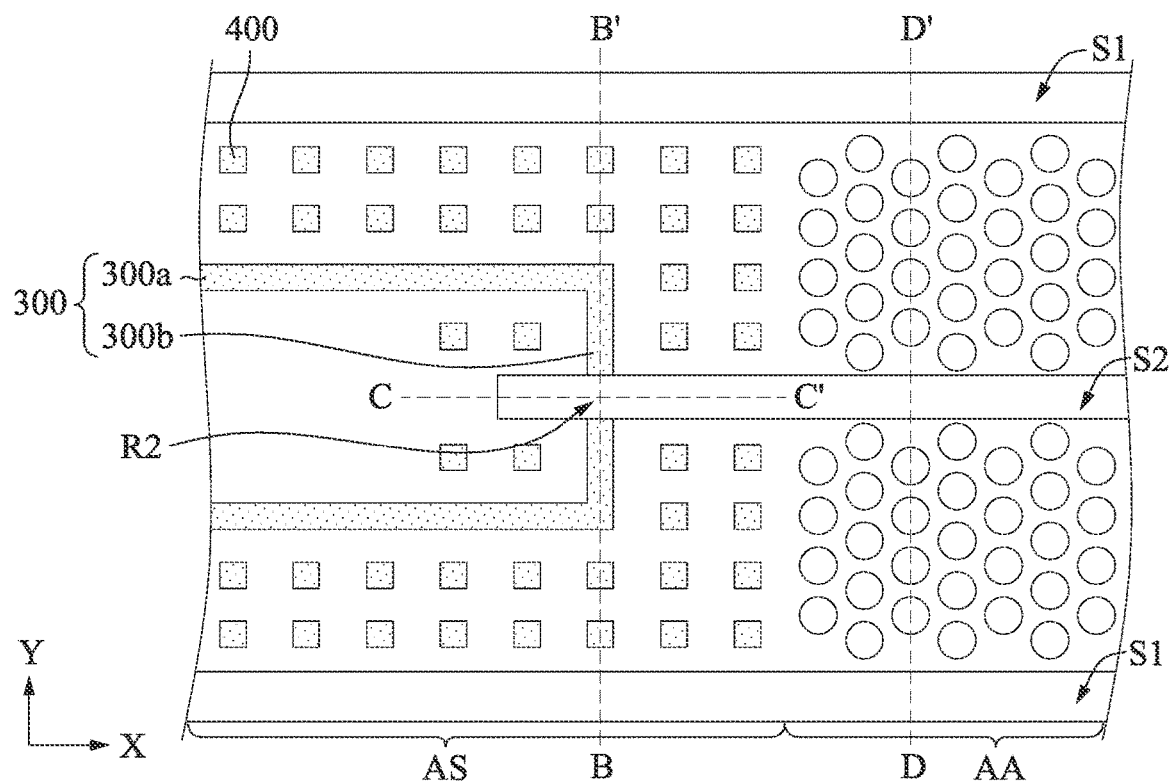
FIG. 3A to FIG. 3D show one of the various stages of manufacturing a three-dimensional memory device in accordance with some embodiments of the present disclosure.

Reference is made to FIG. 1 and FIGS. 3A-3D. In the operation 14 of FIG. 1, a first slit S1 and a second slit S2 are formed in the multi-layered stack 130 and the substrate 100. The first slit S1 and the second slit S2 respectively extends along the X-direction and parallel to each other. As shown in FIG. 3A, the first slit S1 passes through the array area AA and the staircase area AS. The second slit S2 is in contact with the barrier structure 300. In some embodiments, the second slit S2 traverses and crosses with the second portion 300b of the barrier structure 300. In other words, the second slit S2 overlaps with the barrier structure 300 in the top view. Therefore, the second slit S2 cuts off the second portion 300b of the barrier structure 300 into two portions. In some examples, the vertical channel pillars 200 may be separated into two portions in the Y-direction by the first slit S1 and the second slit S2. In some examples, the dielectric pillars 400 may be separated into two or more than two portions in the Y-direction by the first slit S1, the second slit S2 and the barrier structure 300.

Figure 3B:
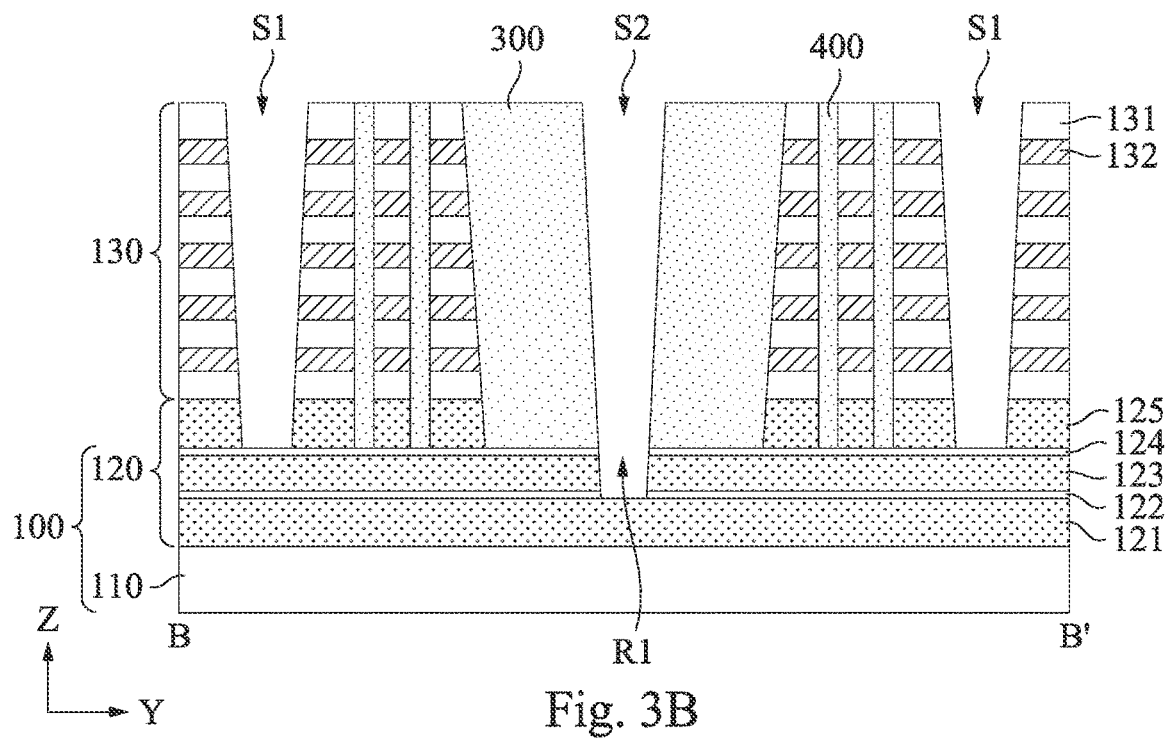
Figure 3C:
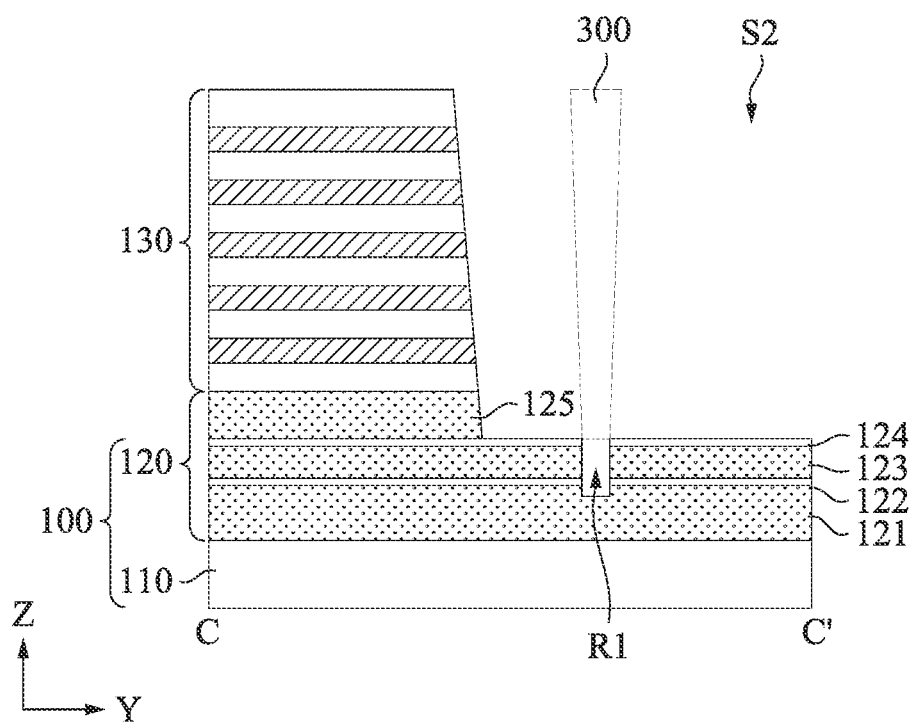
Figure 3D:
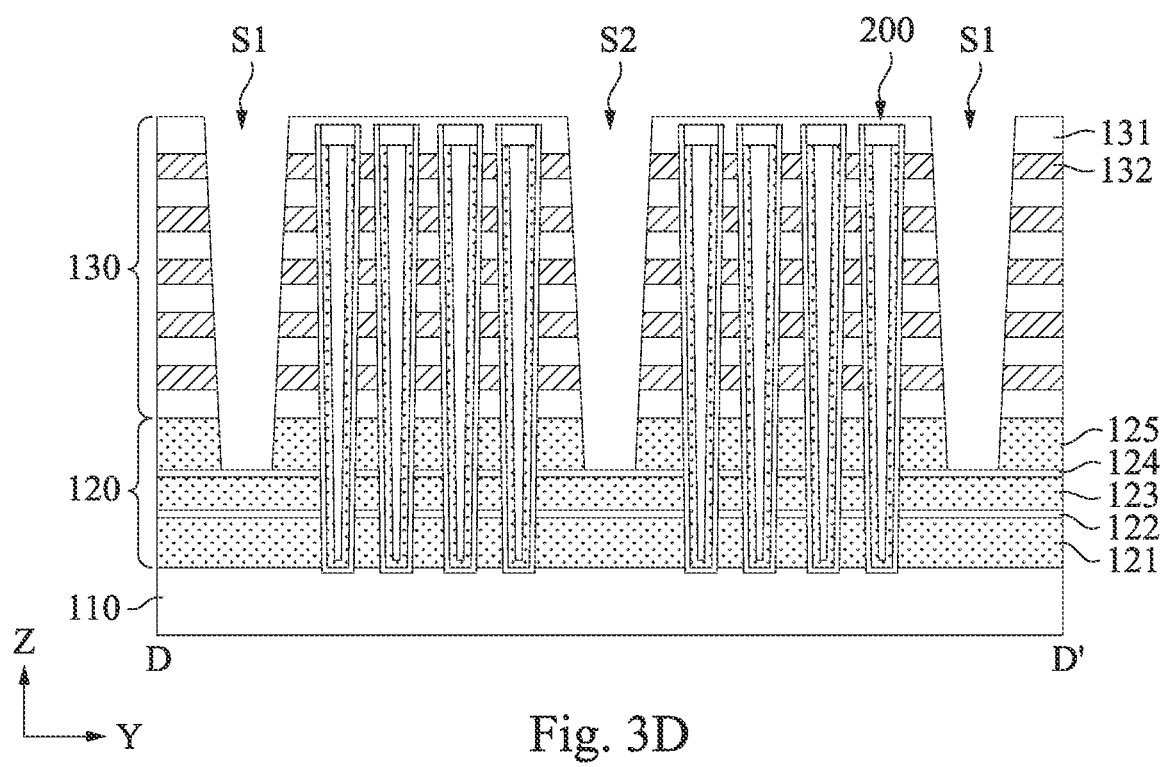

In some embodiments, as shown in FIG. 3D, the first slit S1 and the second slit S2 are formed by removing a portion of the multi-layered stack 130 and the conductive layer 125 to form two grooves extending along the Z-direction and penetrating the multi-layered stack 130. As shown in FIG. 3B, the first slit S1 is recessed from a top surface of the multi-layered stack 130 to expose a sidewall of the conductive layers 125 of the substrate 100. However, the second slit S2 is recessed from a top surface of the barrier structure 300 (second portion 300b) to expose a sidewall of the insulating layers 122, 124 and a sidewall of the conductive layers 123 of the substrate 100. The top surface of the multi-layered stack 130 and the top surface of the barrier structure 300 are substantially coplanar. In some embodiments, the first slit S1 and the second slit S2 respectively has an inclined sidewall. As shown in FIGS. 3B and 3C, the second slit S2 further extends into the conductive layer 123 (which is below the conductive layer 125) of the substrate 100 to form a recess R1 at a region R2 (show in FIG. 3A) that the second slit S2 in contact with the barrier structure 300. Specifically, a portion of the second slit S2 overlaps with the barrier structure 300 (300b) in the region R2 as shown in FIG. 3A. As mentioned in previous section, the barrier structure 300 vertically penetrates the multi-layered stack 130 and extends into the conductive layer 125 the substrate 100. During the formation of the second slit S2 in the region R2, the recess R1 of the second slit S2 may extend further into the conductive layer 123 (or the conductive layer 121) as shown in FIGS. 3B and 3C. A bottom surface of the second slit S2 at the region R2 may be below a bottom surface of the first slit S1 as shown in FIG. 3B.

Figure 4A:
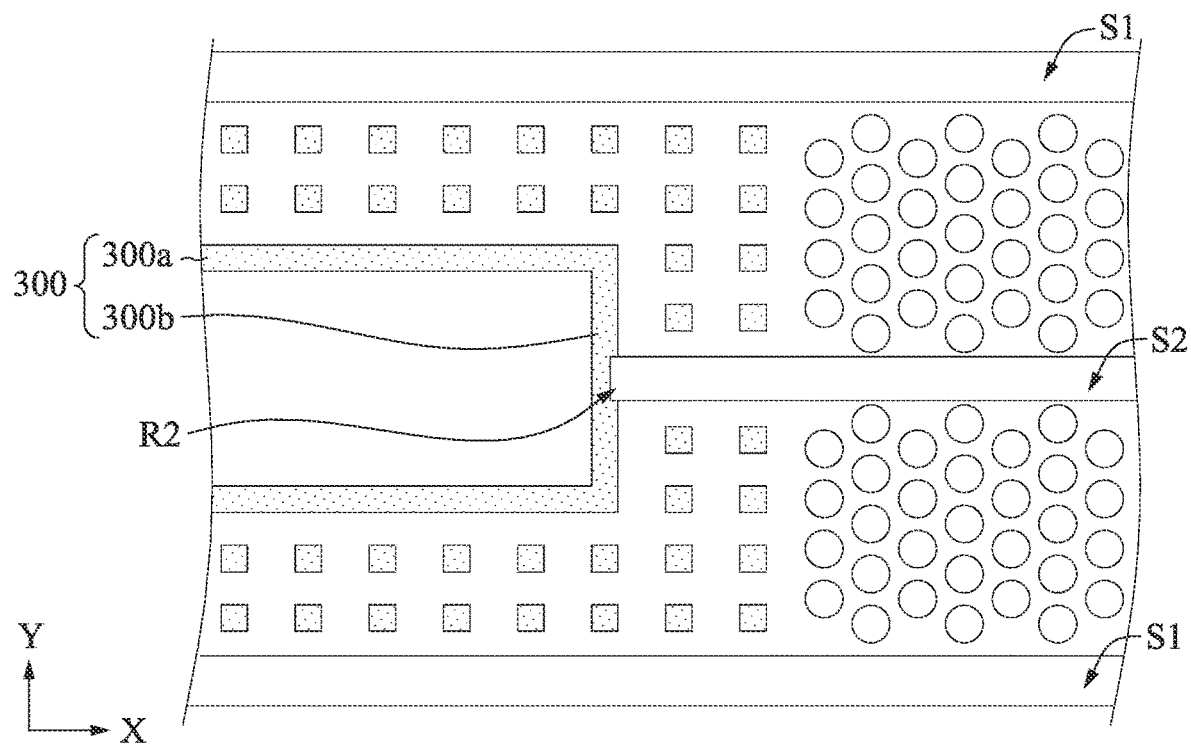
FIGS. 4A and 4B illustrates alternatively embodiments of FIG. 3A in accordance with some embodiments of the present disclosure.
Figure 4B:
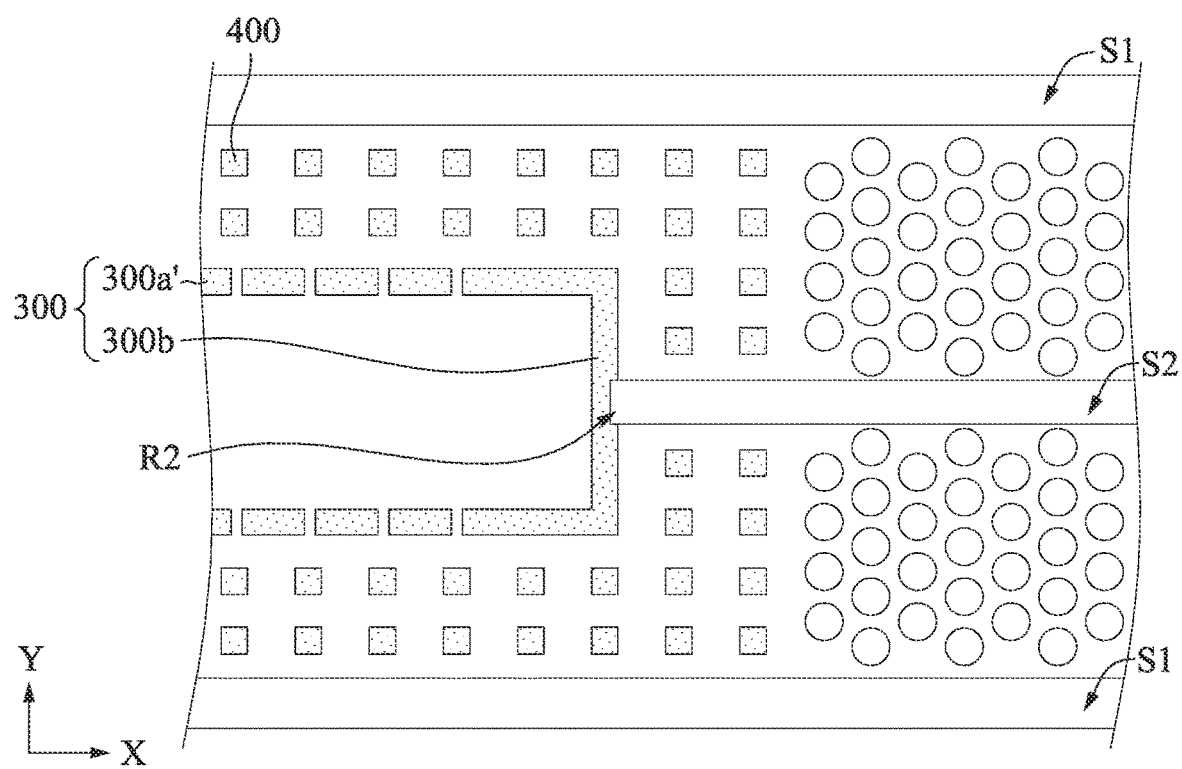

Reference is made to FIGS. 4A and 4B. FIGS. 4A and 4B illustrates alternatively embodiments of FIG. 3A in accordance with some embodiments of the present disclosure. The difference between the structures shown in FIG. 4A and FIG. 3A is that the second slit S2 shown in FIG. 4A does not pass through the second portion 300b of barrier structure 300. Therefore, the second slit S2 does not cut off the barrier structure 300. In other embodiments, as shown in FIG. 4B, the first portion 300a' of the barrier structure 300 includes a plurality of segments spaced apart from each other. The first portion 300a' of the barrier structure 300 may be cut off randomly or may be cut into uniform segments. In this embodiment, the second slit S2 may traverse the second portion 300b of the barrier structure 300 as shown in FIG. 3A, or may not pass through the second portion 300b of the barrier structure 300 as shown in FIG. 4B. It should be understood that the arrangement of these segments shown in FIG. 4B is merely an example, and is not limited thereto.

Figure 5A:
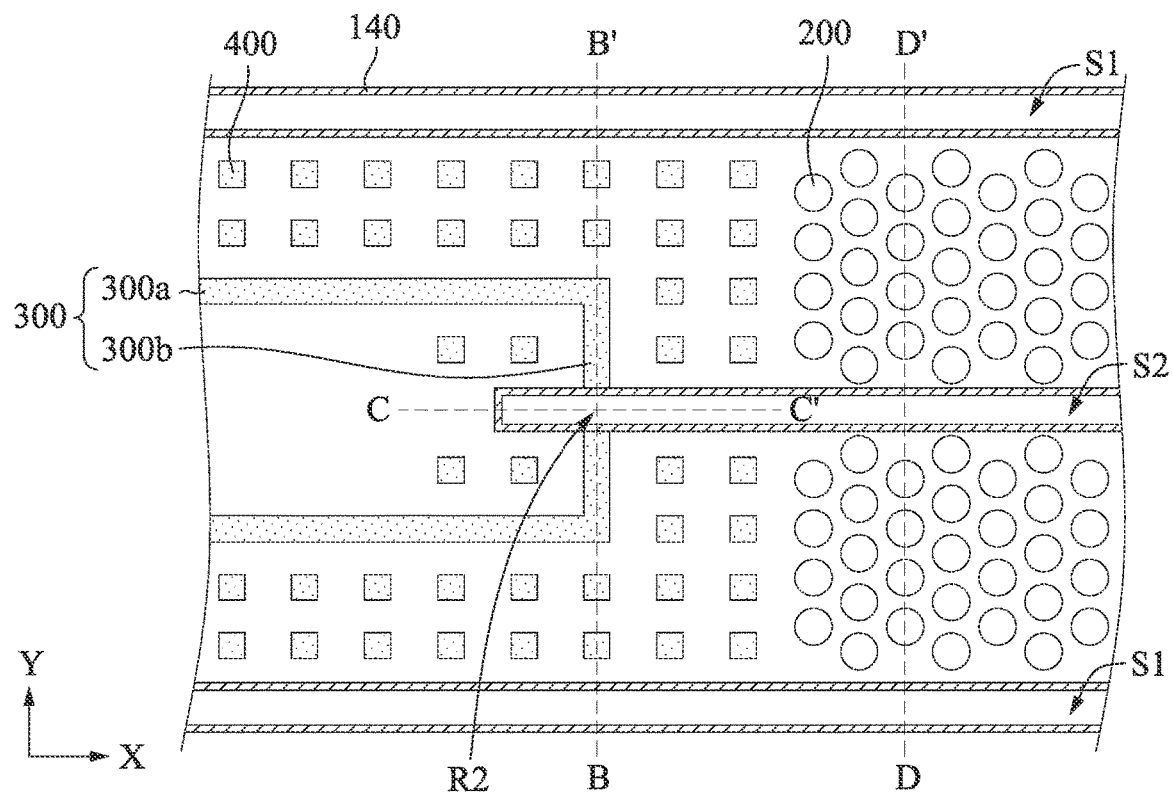
FIG. 5A to FIG. 5D show one of the various stages of manufacturing a three-dimensional memory device in accordance with some embodiments of the present disclosure.
Figure 5B:
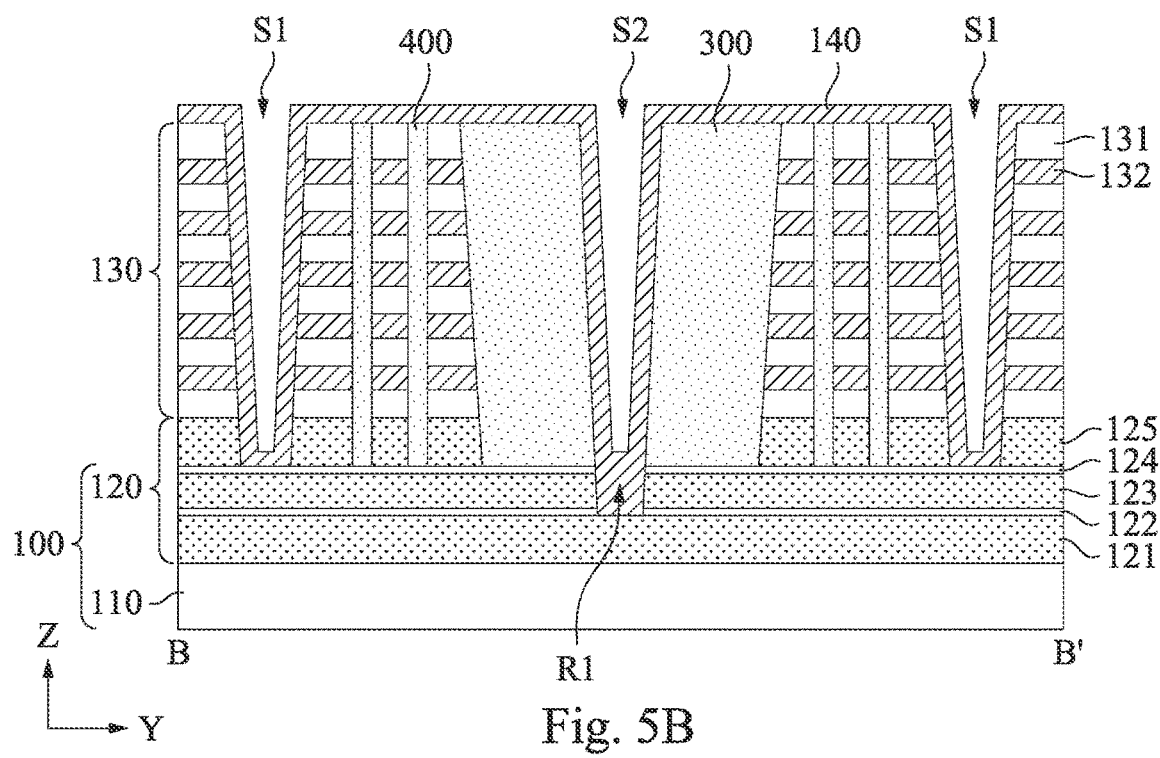
Figure 5C:
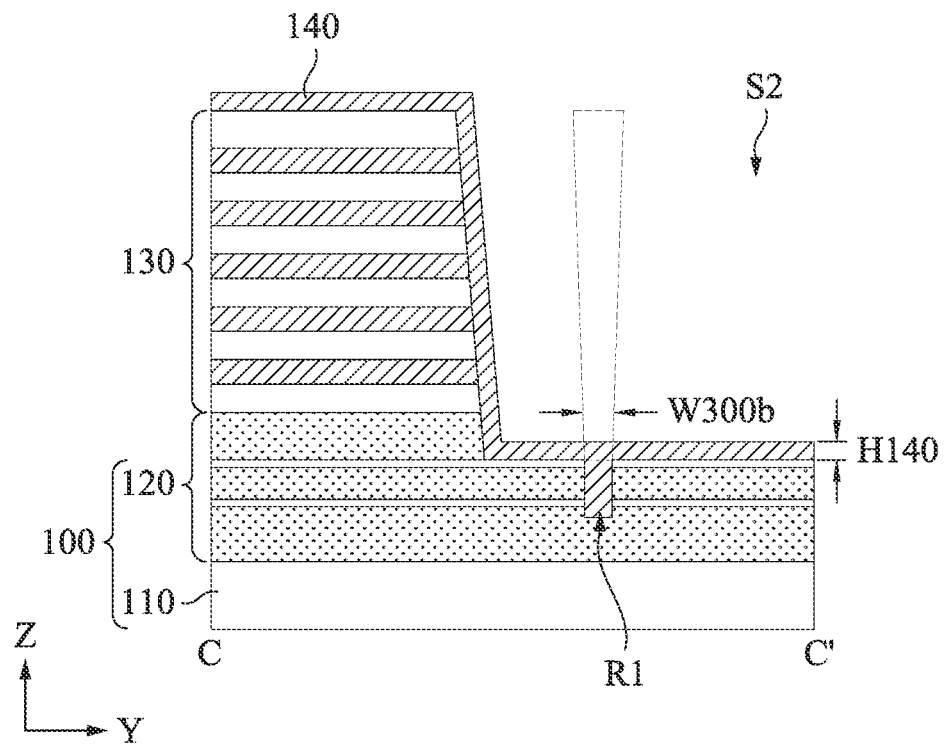
Figure 5D:
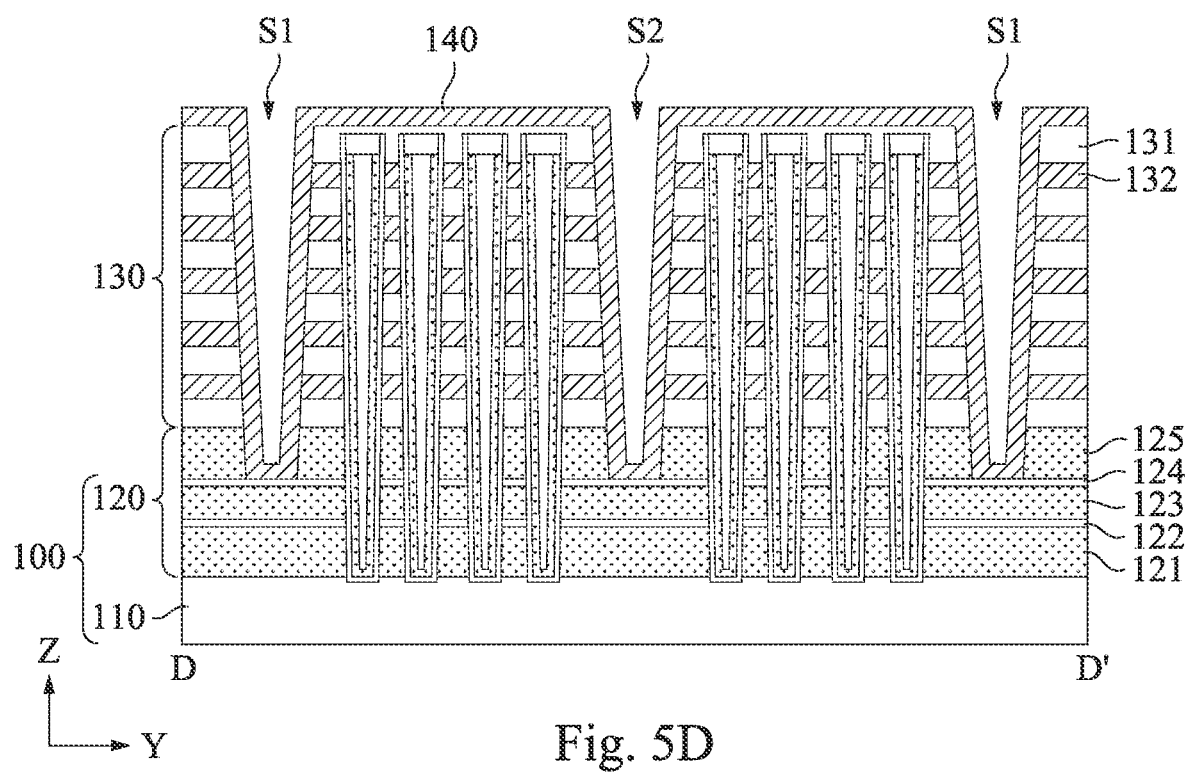

Reference is made to FIGS. 5A-5D. A spacer material 140 is formed in the first slit S1 and the second slit S2. The spacer material 140 on the top surface of the multi-layered stack 130 is not shown in FIG. 5A for clarity. In some embodiments, the spacer material 140 is formed on the sidewall and a bottom of the first slit S1 and the second slit S2 by suitable deposition method. In some embodiments, the spacer material 140 includes silicon nitride, but is not limited thereto. As shown in FIGS. 5B and 5C, the recess R1 in the region R2 is filled with spacer material 140. The spacer material 140 has a thickness H140. In some embodiments, a ratio of the thickness H140 to the width W300b of the barrier structure 300 (i.e., a width of the recess R1) is greater than 0.5.

Figure 6A:
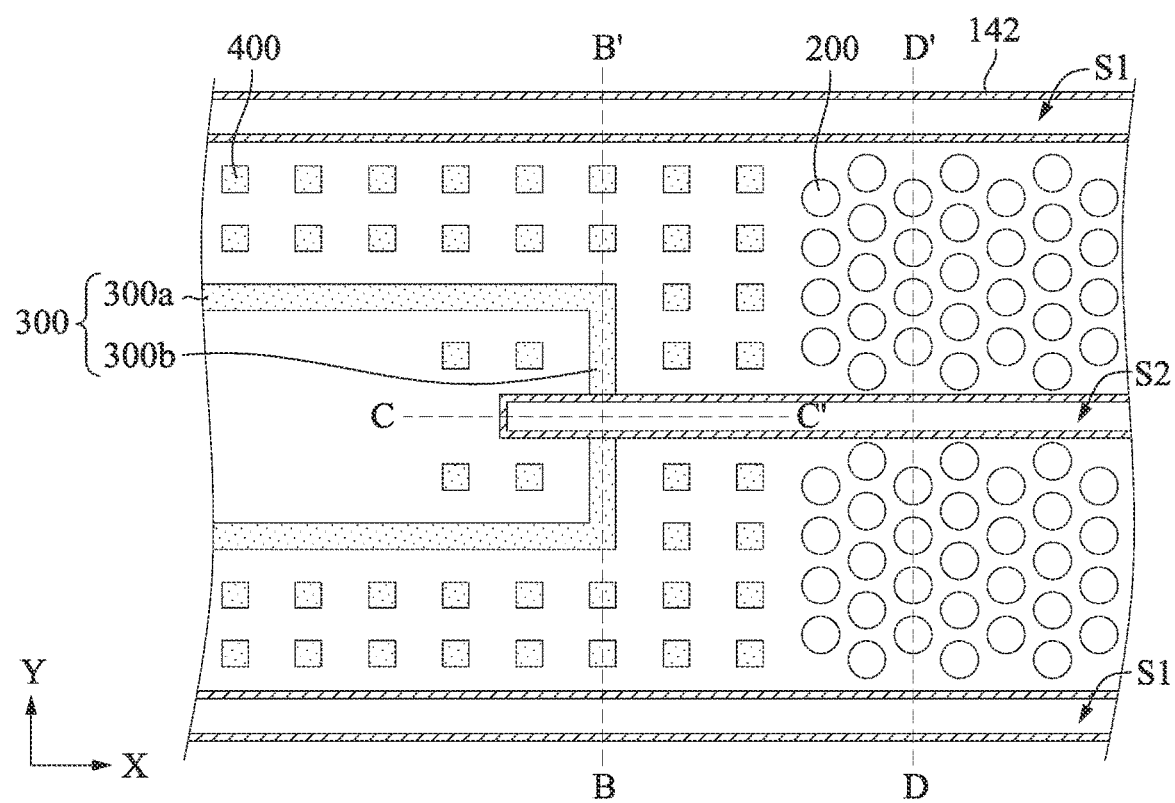
FIG. 6A to FIG. 6D show one of the various stages of manufacturing a three-dimensional memory device in accordance with some embodiments of the present disclosure.
Figure 6B:
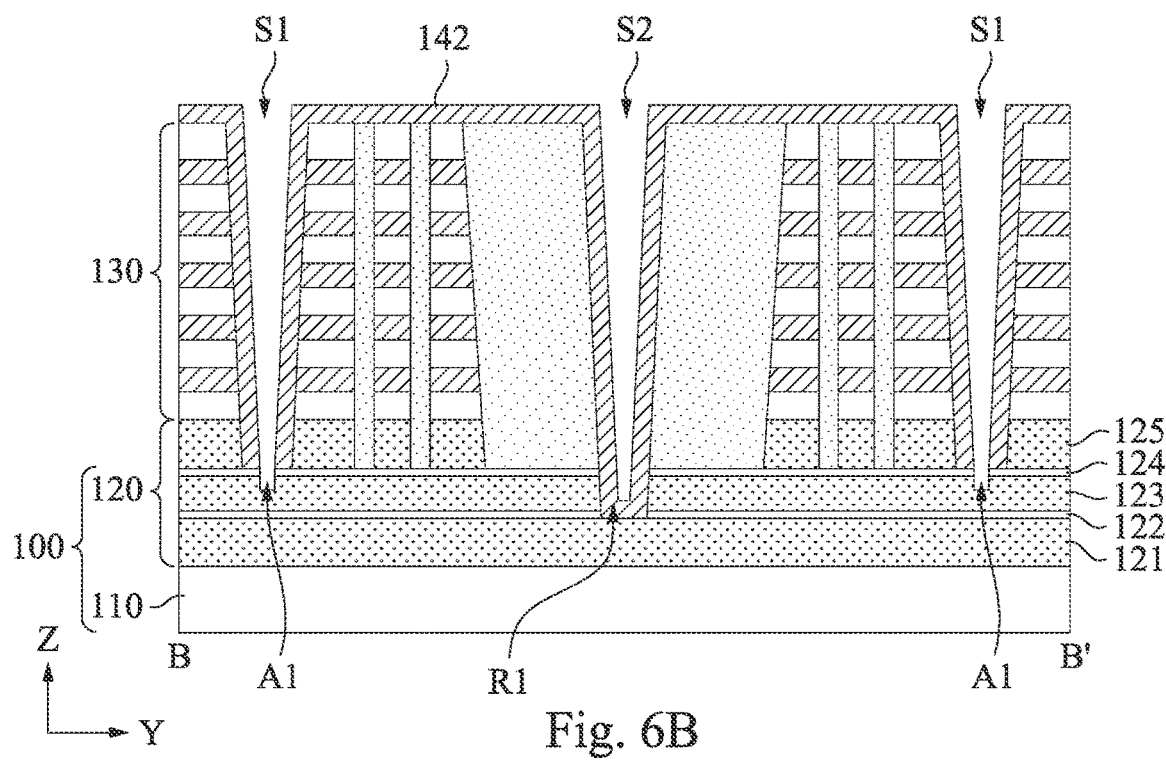
Figure 6C:
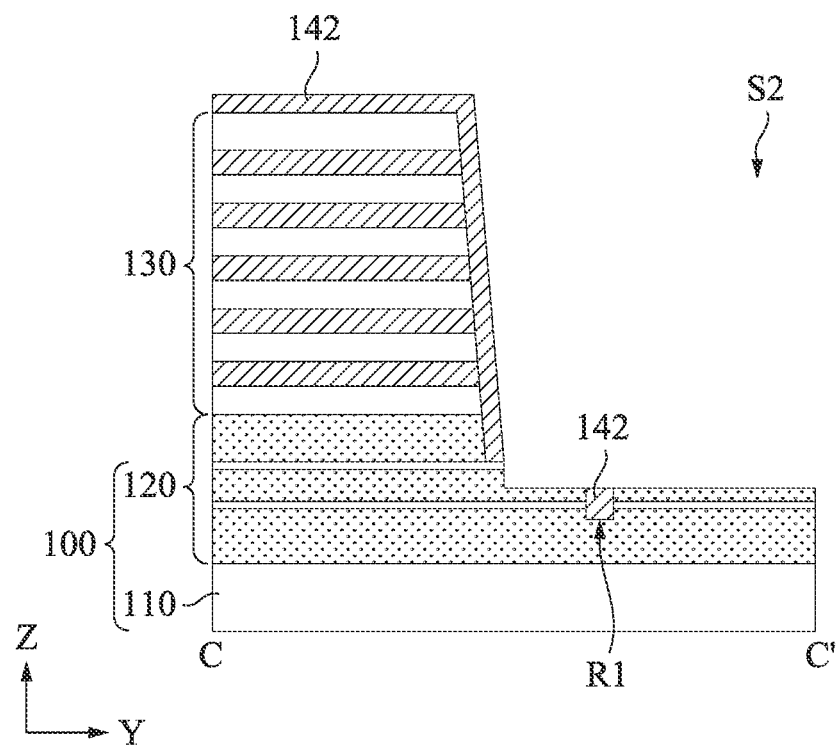
Figure 6D:
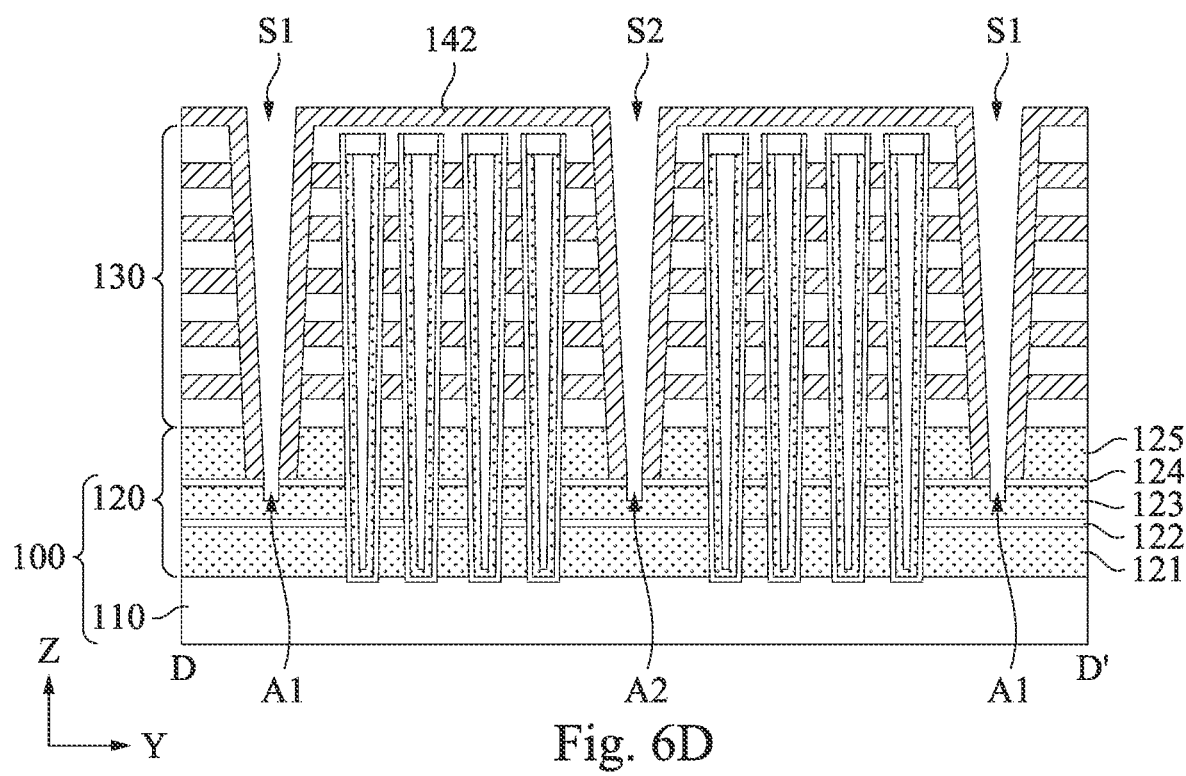

Reference is made to FIGS. 6A-6D. A portion of the spacer material 140 is removed to form a spacer layer 142 exposing the conductive layer 123 of the substrate 100. In some embodiments, as illustrate in FIG. 6D, the spacer material 140 on the bottom of the first slit S1 and the second slit S2 is removed to form a first aperture A1 and a second aperture A2 exposing a sidewall of the insulating layer 124 and a sidewall the conductive layer 123. A portion of the insulating layer 124 and conductive layer 123 are further removed in the formation of the first aperture A1 and the second aperture A2. As shown in FIG. 6B and FIG. 6C, the spacer layer 142 filled in the recess R1 in the region R2 is remained when removing the spacer material 140 on the insulating layer 124. As mentioned in the previous section, the thickness H140 the spacer material 140 is less than the width W300b of the barrier structure 300 (i.e., a width of the recess R1). The recess R1 is fully filled by the spacer material 140. During the removal of a portion of the spacer material 140, the spacer layer 142 located in the recess R1 at the region R2 (shown in FIG. 3A) is remained.

Figure 7A:
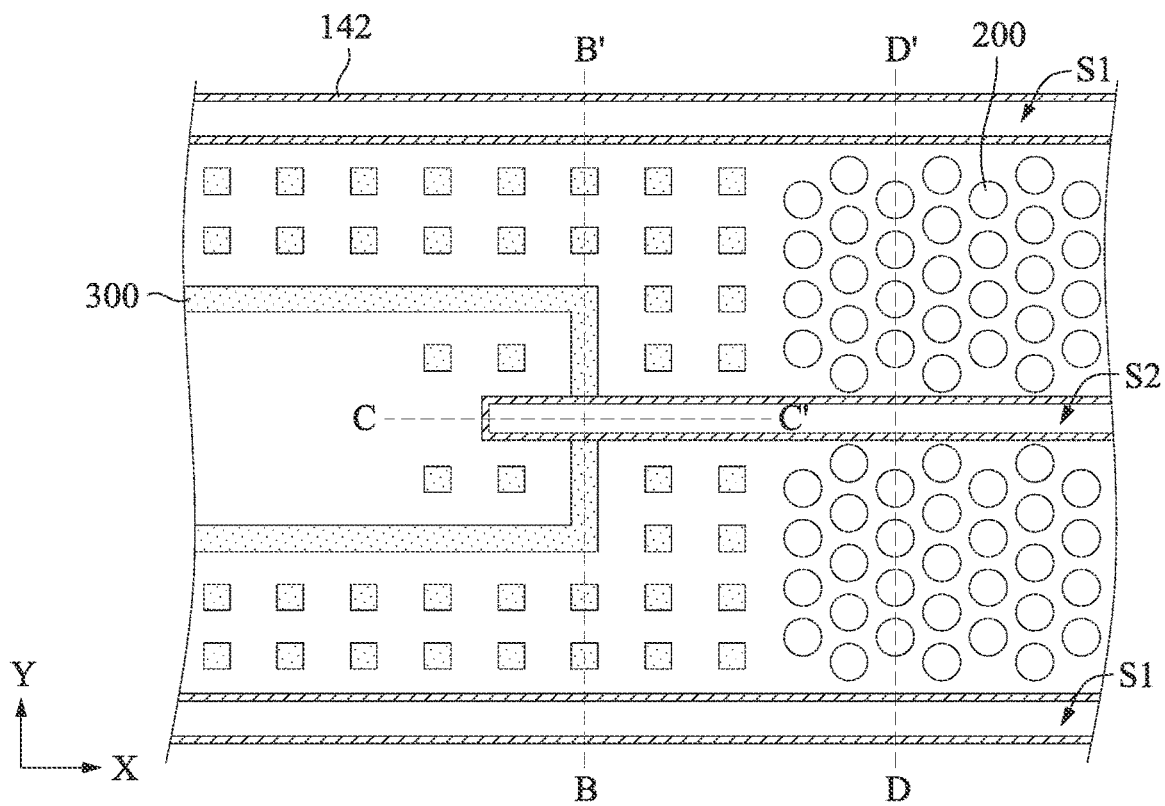
FIG. 7A to FIG. 7D show one of the various stages of manufacturing a three-dimensional memory device in accordance with some embodiments of the present disclosure.
Figure 7B:
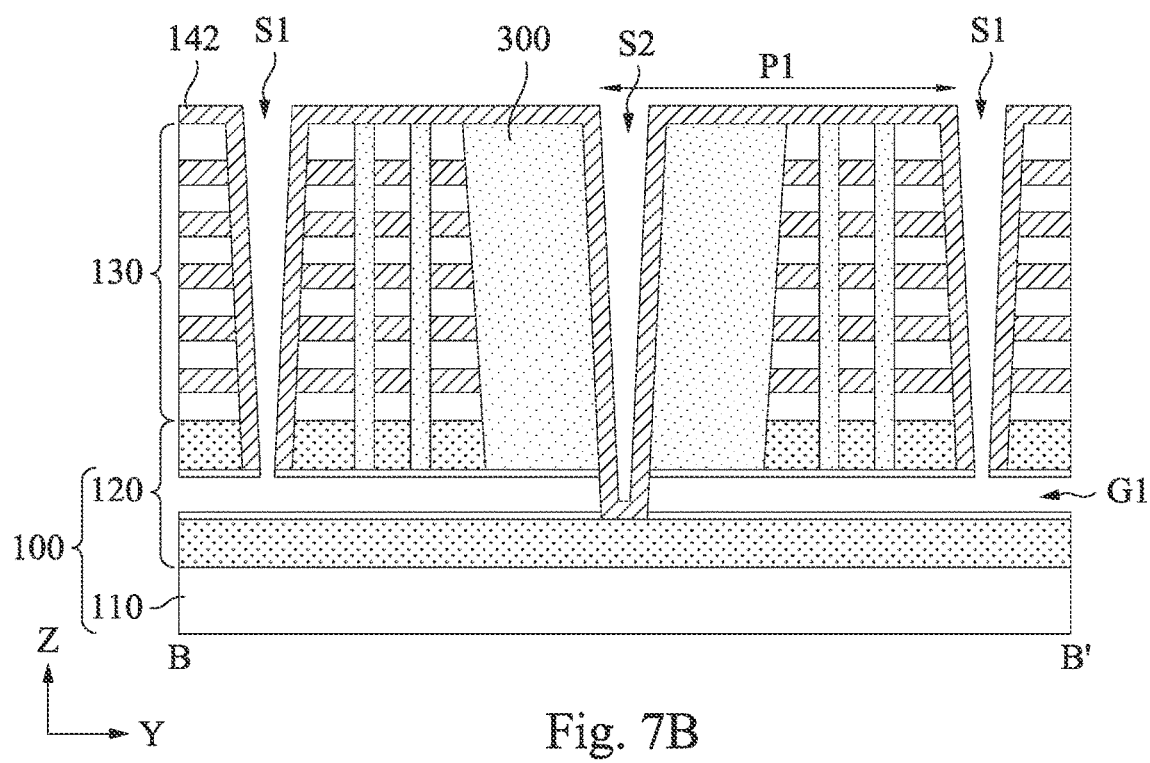
Figure 7C:
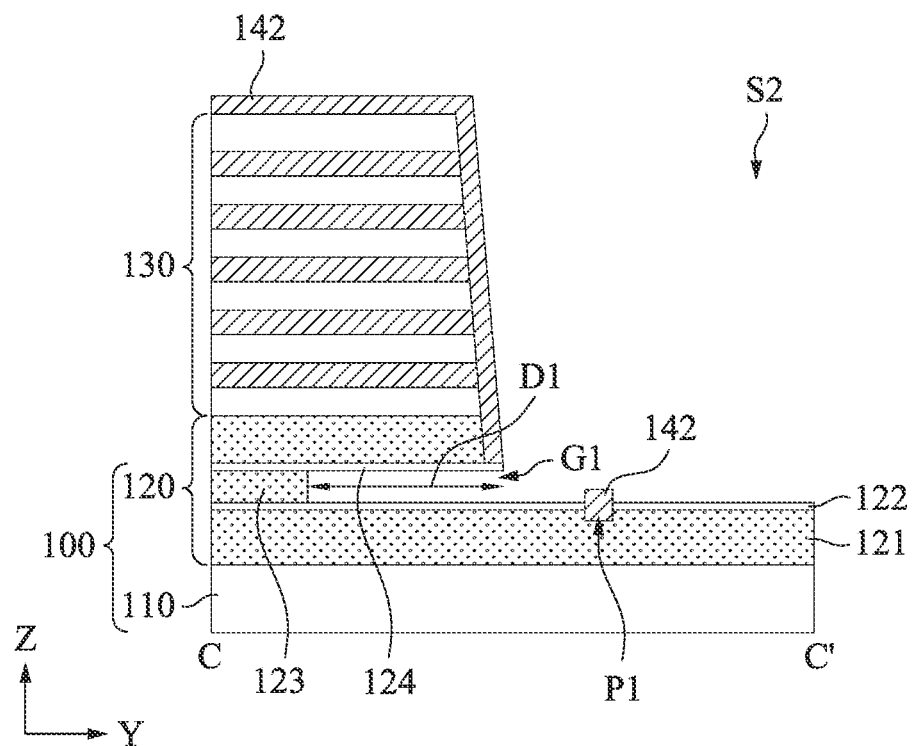
Figure 7D:
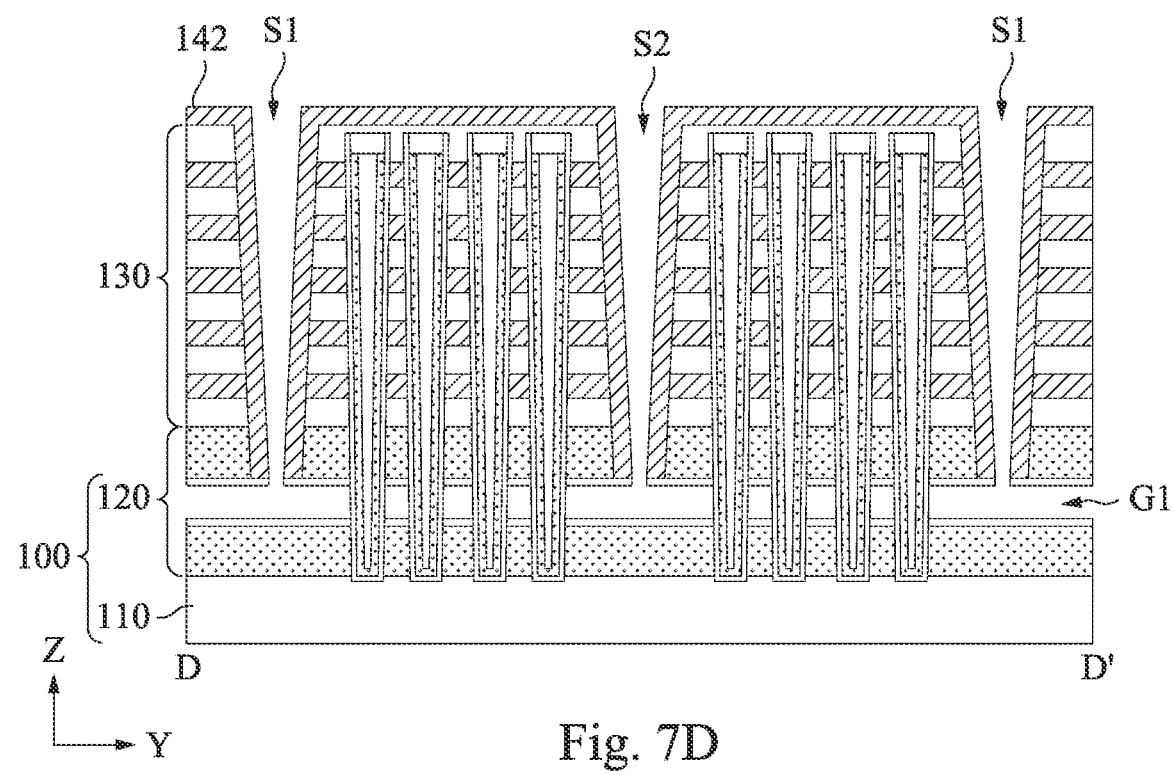

Reference is made to FIGS. 7A-7D. A portion of the substrate 100 is removed to form a cavity G1. In some embodiments, a portion of the conductive layer 123 of the substrate 100 is removed through the first aperture A1 and the second aperture A2 (shown in FIG. 6D). As shown in FIG. 7C, the conductive layer 123 is recessed from the second slit S2 to form the cavity G1 between the insulating layers 122 and 124. The cavity G1 communicating the second slit S2 has a depth D1 in the X-direction, as illustrated in FIG. 7C. The first slit S1 and the second slit S2 have a pitch P1 between thereof, as illustrated in FIG. 7B. In some embodiments, a ratio of the depth D1 to the pitch P1 is about 0.5-1.

Figure 8A:
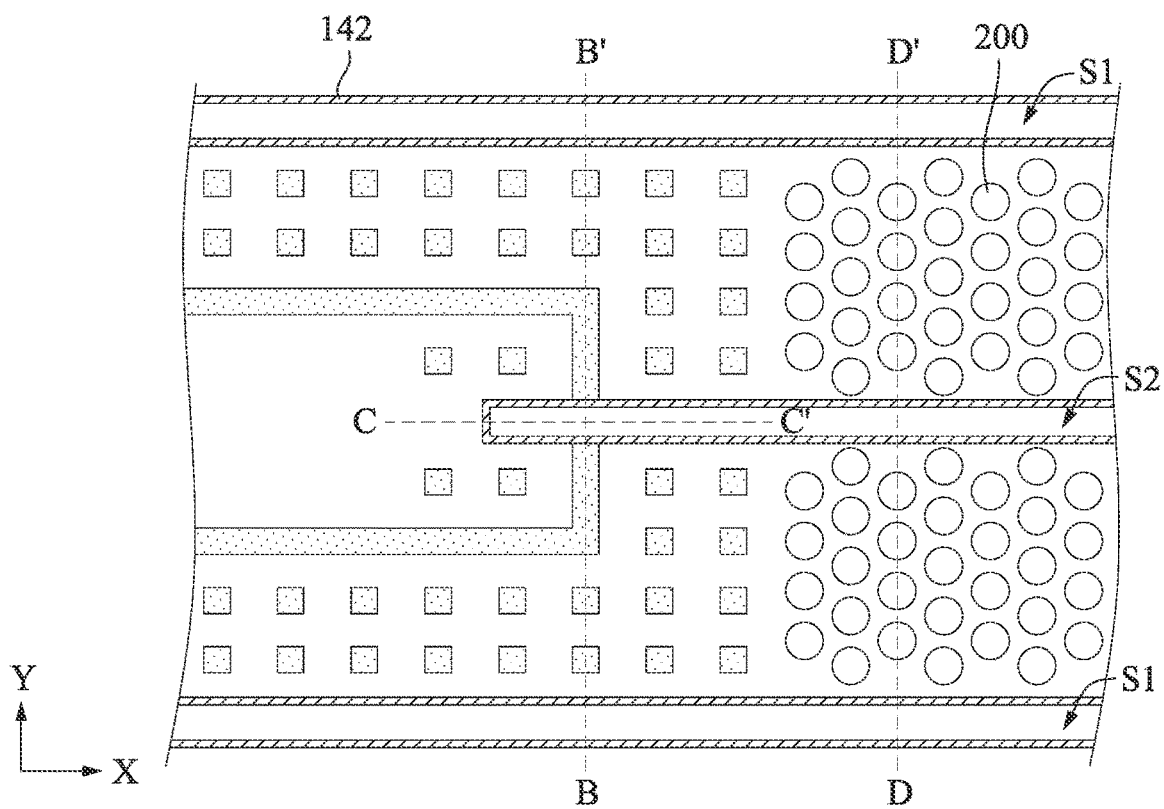
FIG. 8A to FIG. 8D show one of the various stages of manufacturing a three-dimensional memory device in accordance with some embodiments of the present disclosure.
Figure 8B:
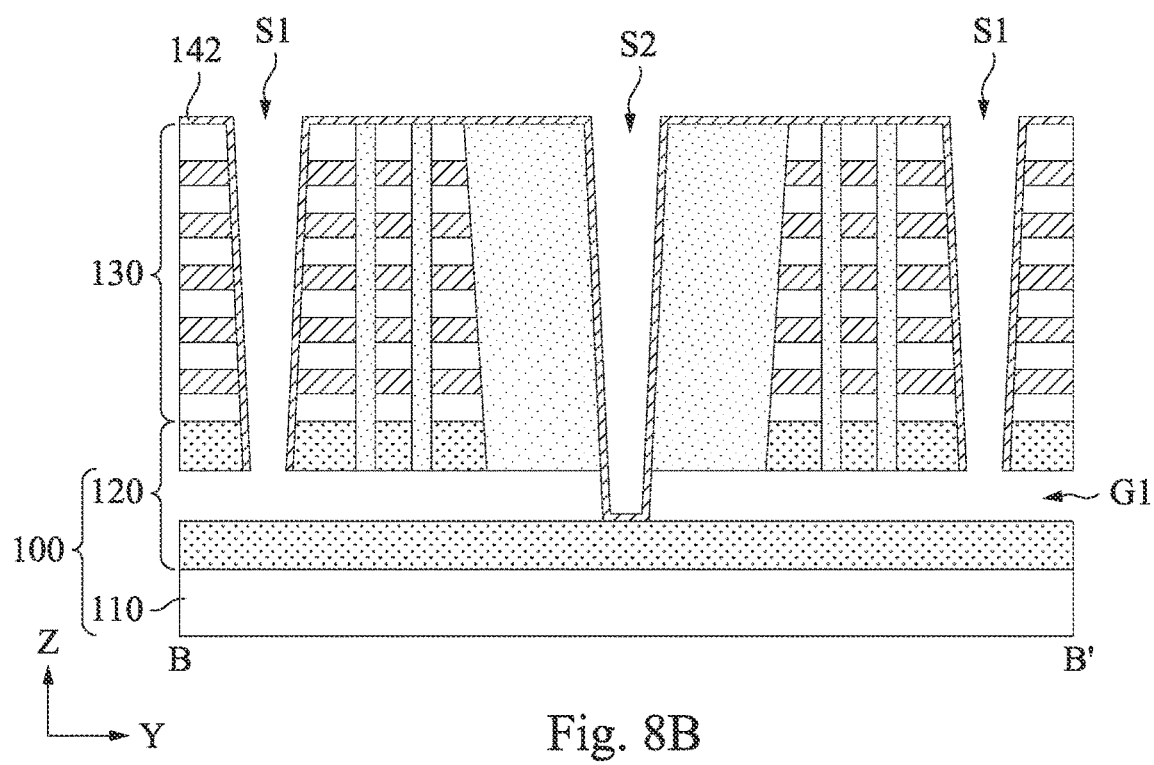
Figure 8C:
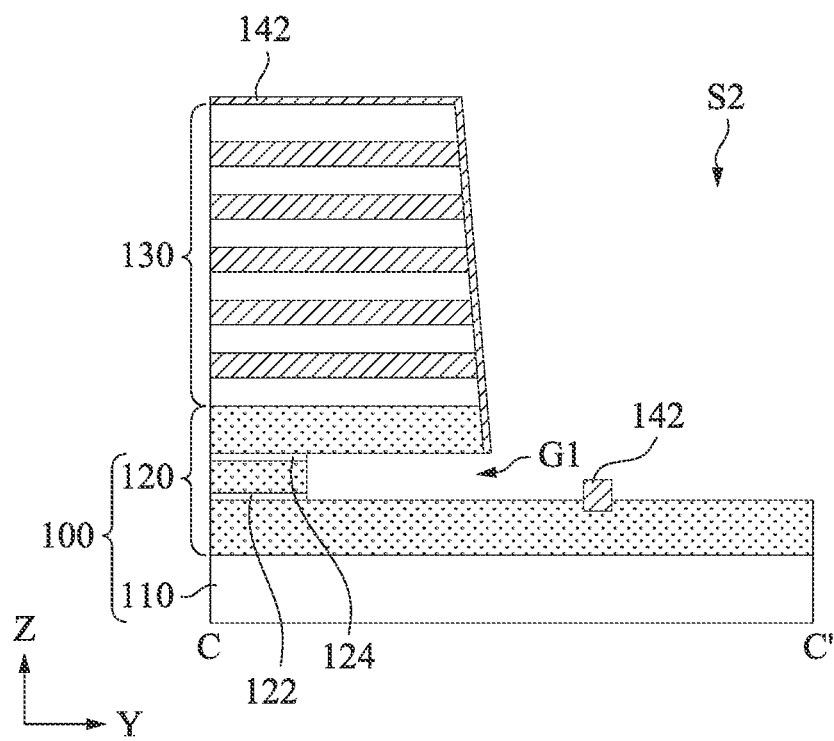
Figure 8D:
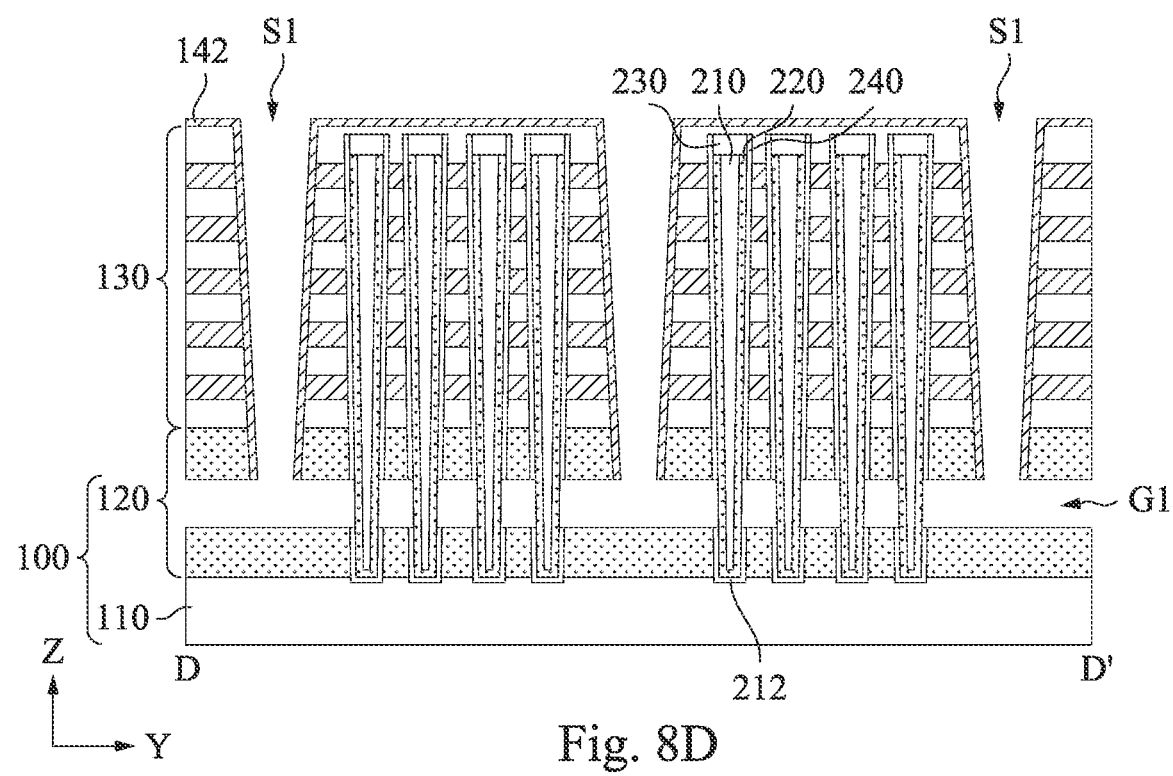
Figure 9A:
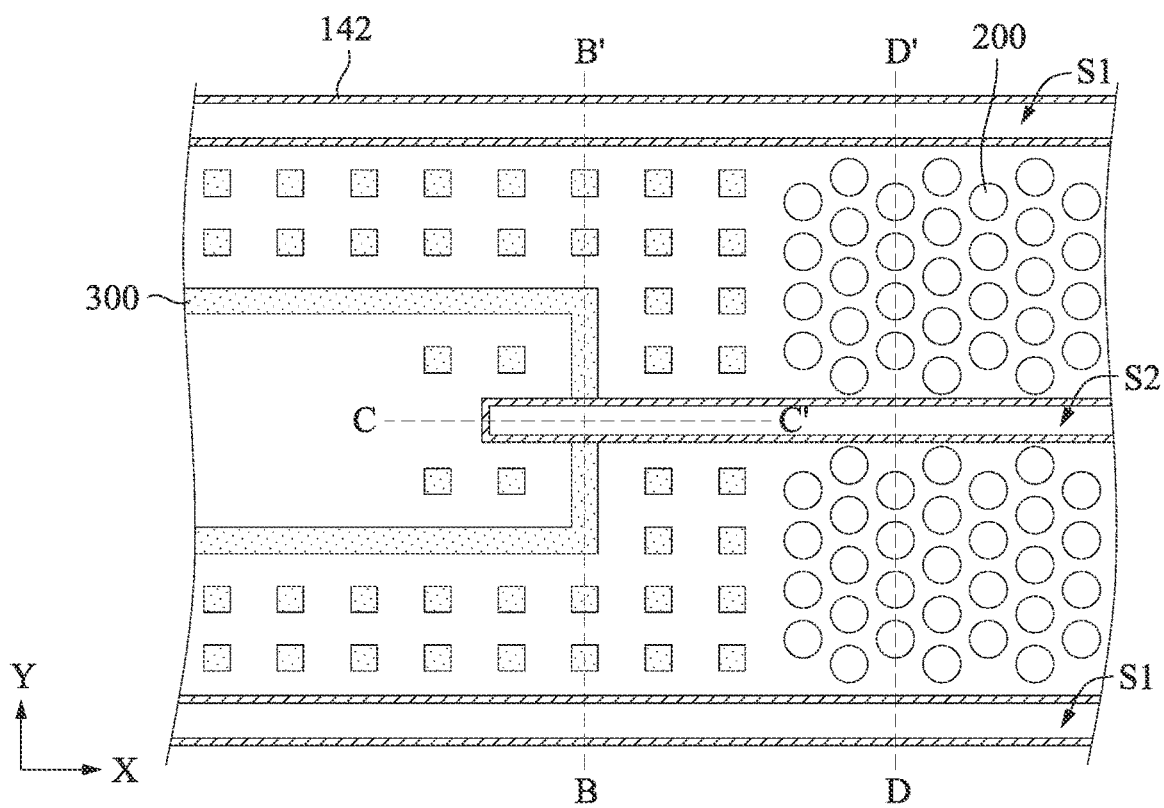
FIG. 9A to FIG. 9D show one of the various stages of manufacturing a three-dimensional memory device in accordance with some embodiments of the present disclosure.
Figure 9B:
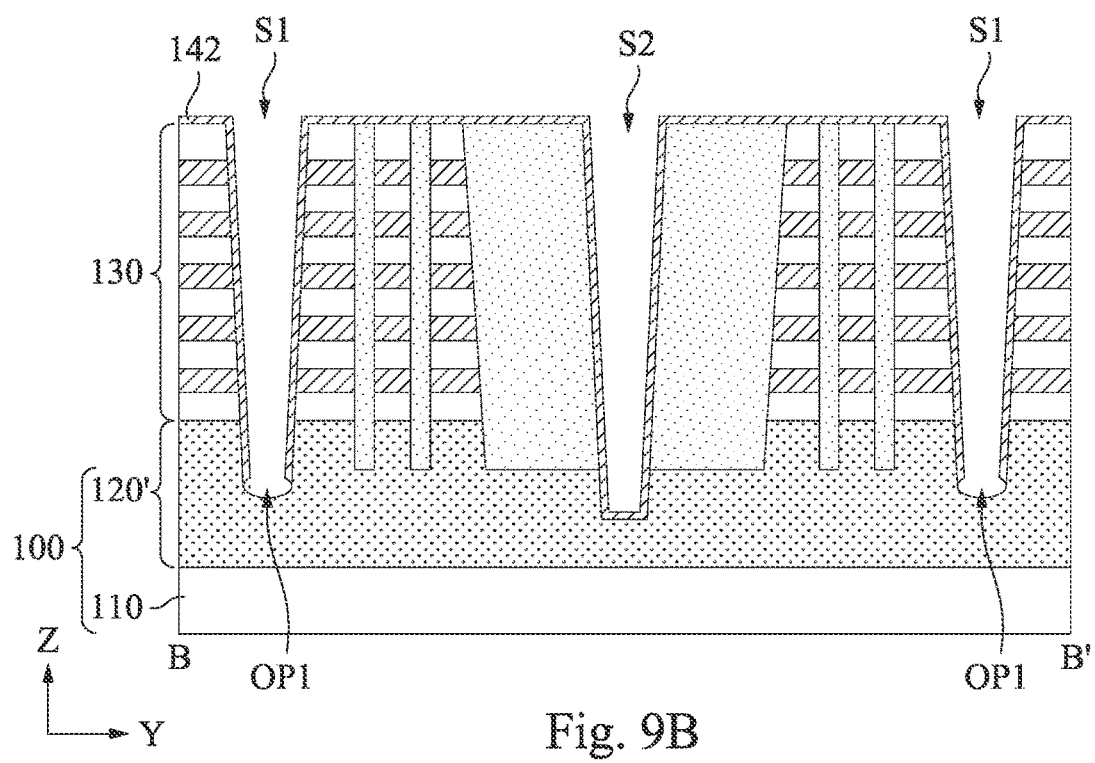
Figure 9C:
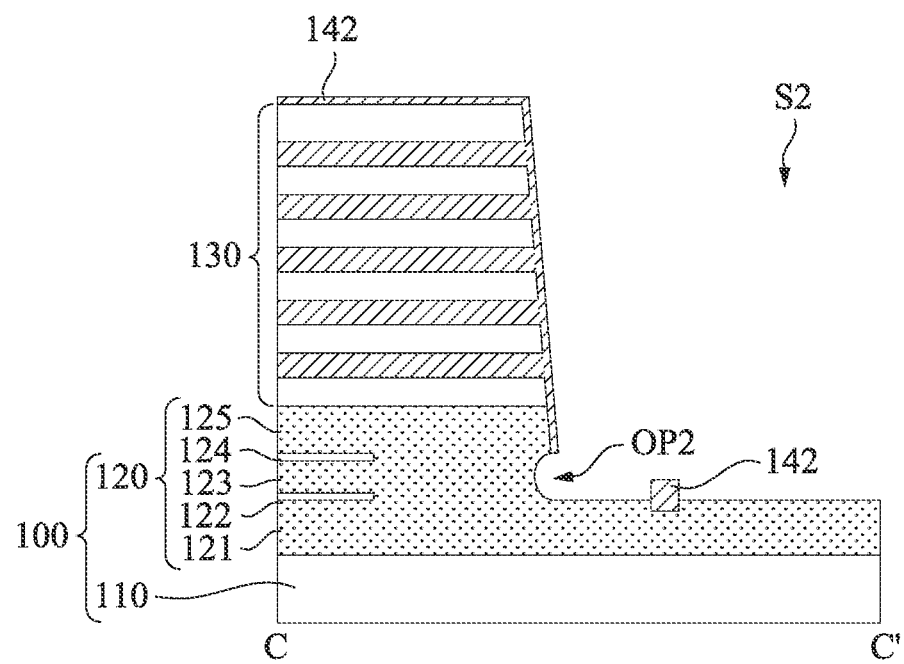
Figure 9D:
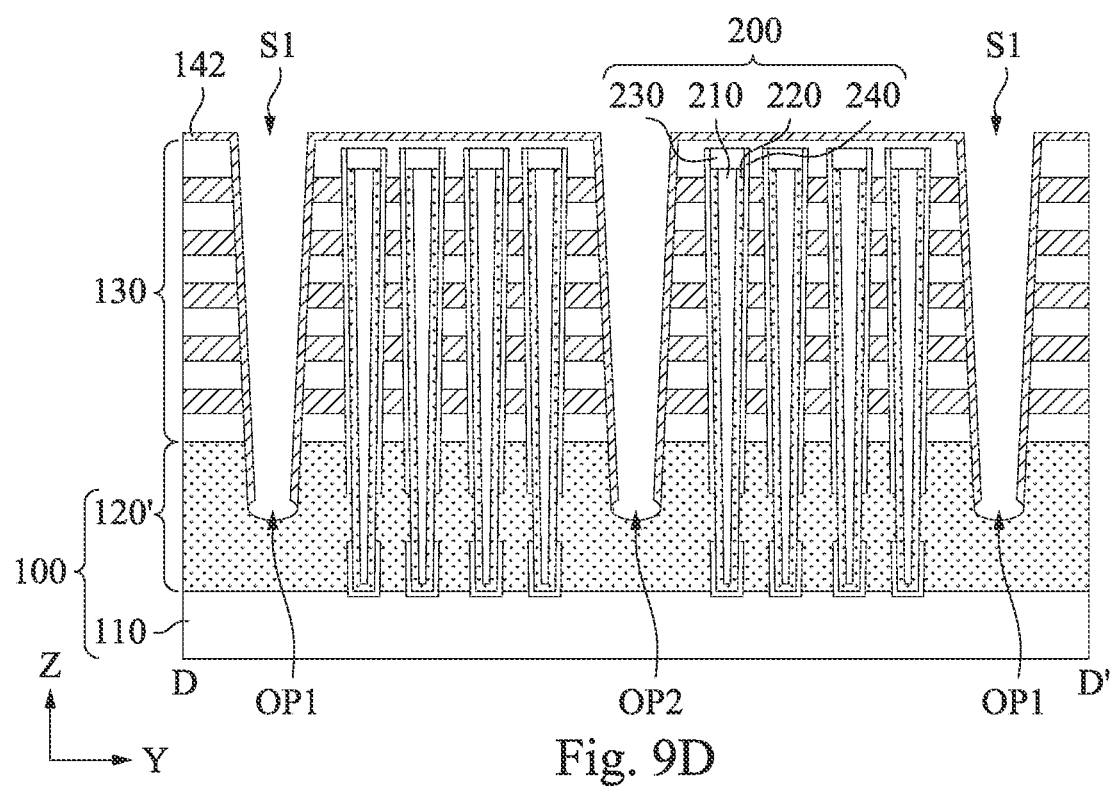

Reference is made to FIGS. 8A-8D. The charge trapping layer 240 exposed by the cavity G1 is removed. In some embodiments, the exposed charge trapping layer 240 is removed through the first slit S1 and the second slit S2 to expose the channel layer 220 as shown in FIG. 8D. During removing the exposed charge trapping layer 240, the spacer layer 142 is thinned, and a portion of the insulating layers 122 and 124 is also removed. As shown in FIG. 8C, the spacer layer 142 is still remained in the recess R1.

Reference is made to FIGS. 9A-9D. The cavity G1 is filled with a material that is same as the substrate 100. In some embodiments, a conductive material (i.e., polysilicon) same as that of the conductive layer 123 is refilled in the cavity G1 to form an upper portion 120' of the substrate 100. The conductive material is in contact with the channel layer 220 of the vertical channel pillars 200. A portion of the conductive material in the first slit S1 and the second slit S2 may be further removed to form a first opening OP1 and a second opening OP2 respectively exposing the sidewall of the spacer layer 142 in the first slit S1 and the second slit S2.

Figure 10A:
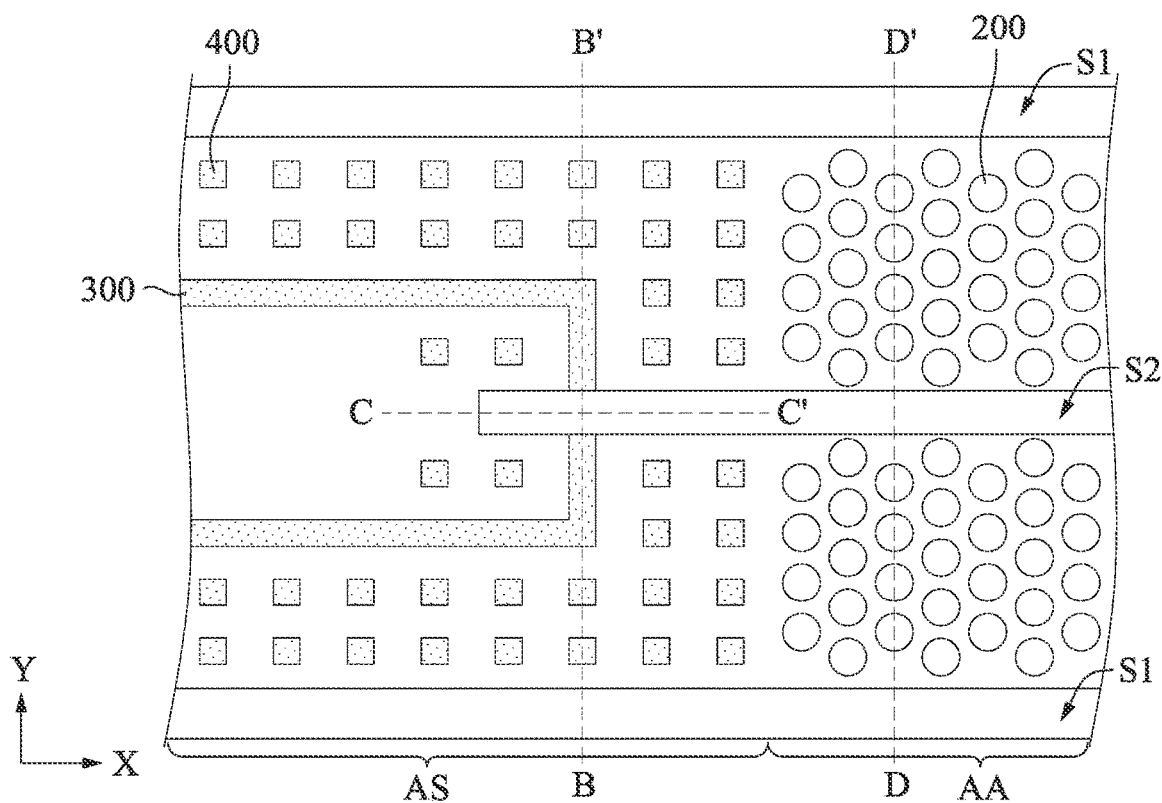
FIG. 10A to FIG. 10D show one of the various stages of manufacturing a three-dimensional memory device in accordance with some embodiments of the present disclosure.
Figure 10B:
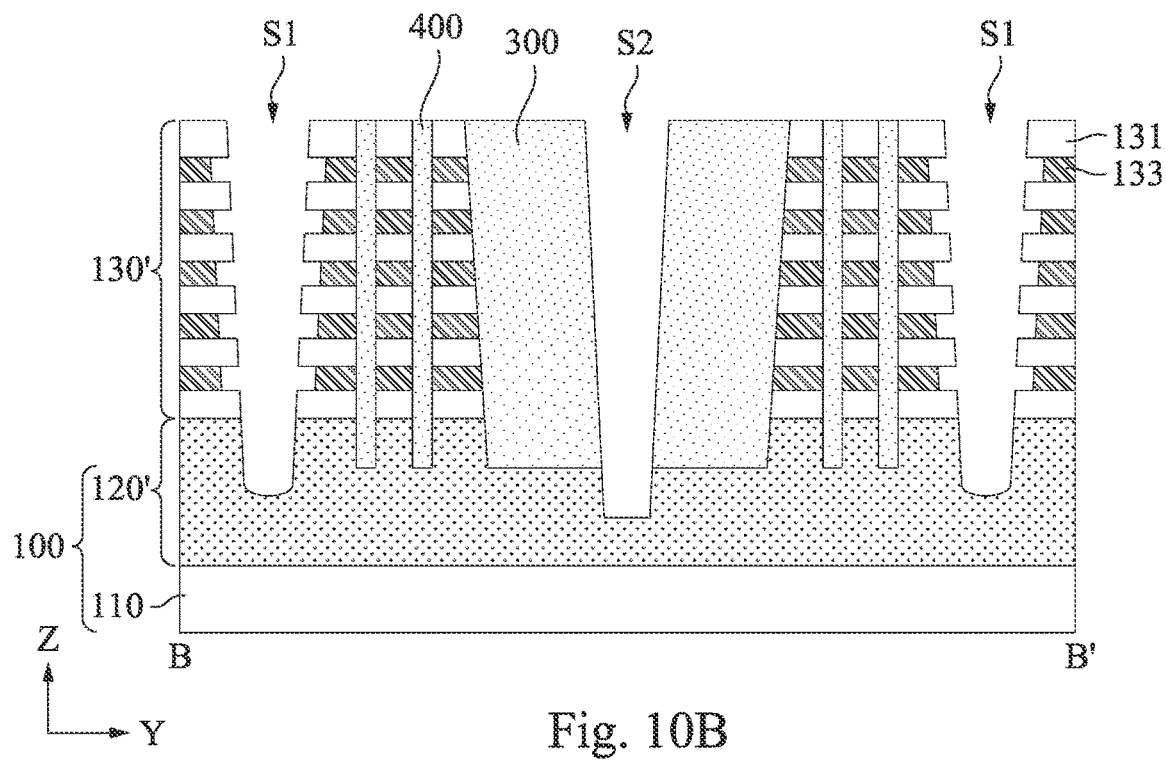
Figure 10C:
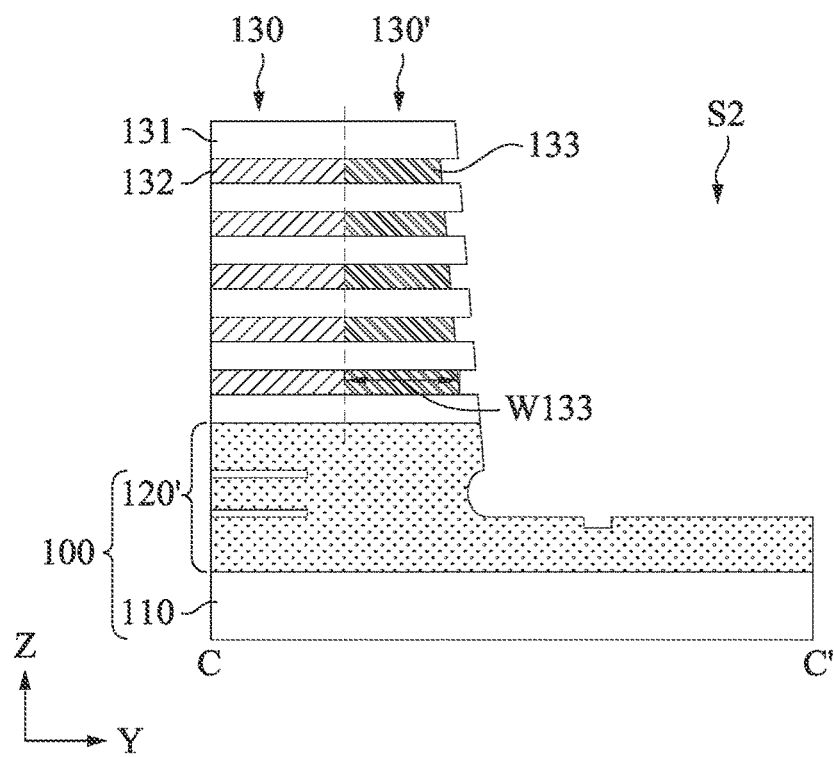
Figure 10D:
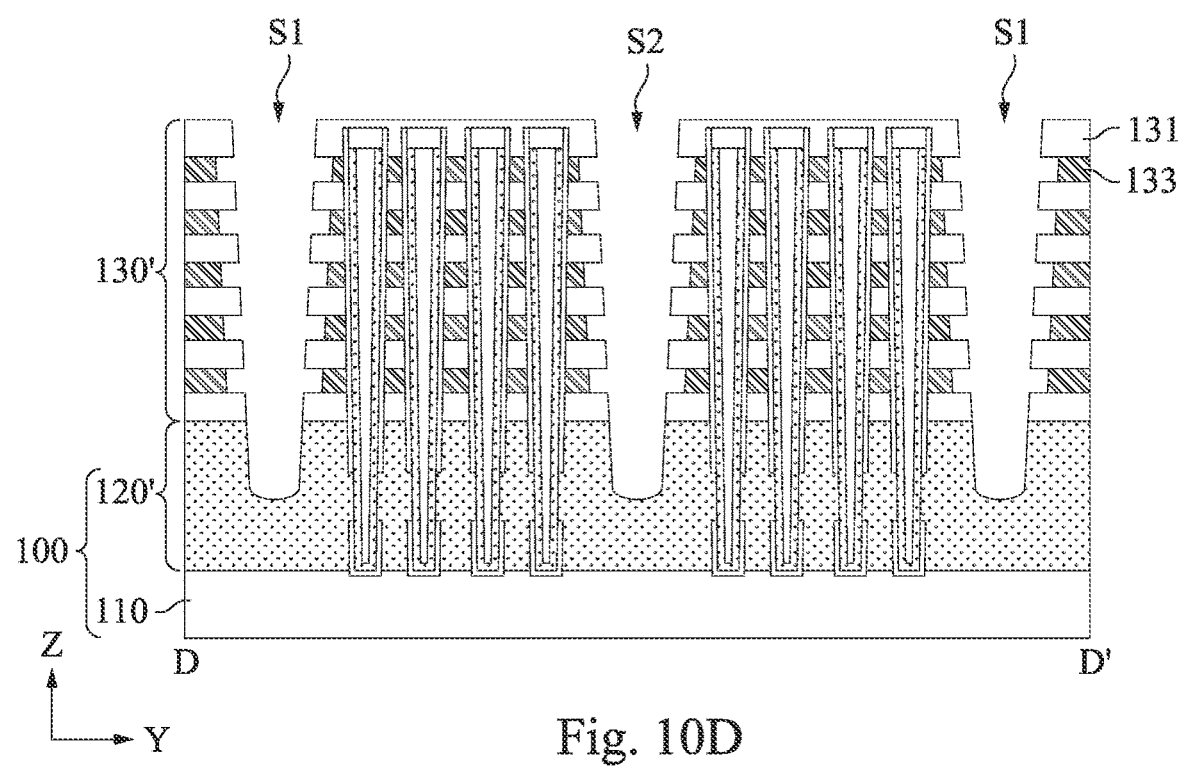

Reference is made to FIG. 1 and FIGS. 10A-10D. In the operation 16 of FIG. 1, a portion of the second insulating layers 132 are replaced with a plurality of conductive layers 133. In some embodiments, the conductive layers 133 include metal (e.g., Titanium (Ti), tungsten (W), aluminum (Al), copper (Cu), gold (Au), silver (Ag) or alloys of thereof), metal oxide, or other suitable conductive material. The spacer layer 142 (shown in FIGS. 9A-9D) may be removed before the replacing process. In some embodiments, replacing the second insulating layers 132 with the conductive layers 133 includes removing the second insulating layer 132 exposed by the first slit S1 and the second slit S2 to form a plurality of lateral openings (not shown) between the first insulating layers 131. The conductive material is then formed in the lateral openings by suitable deposition method. The conductive material filled in the lateral openings is then recessed to form the conductive layers 133. As shown in FIG. 10B, each of the conductive layers 133 is recessed from the sidewall of the first insulating layers 131. As shown in FIG. 10O, a portion of the second insulating layers 132 surrounded by the barrier structure 300 is remained without replacing with the conductive layers 133. The conductive layers 133 have a width W133 in the X-direction. In some embodiments, a ratio of the width W133 to the pitch P1 (shown in FIG. 7B) of the first slit S1 and the second slit S2 is about 0.5-0.7. In some embodiments, all of the second insulating layers 132 in the array area AA are replaced by the conductive layers 133, as illustrate in FIG. 10B and FIG. 10D. The barrier structure 300 and the dielectric pillars 400 penetrating the multi-layered stack 130 can support the first insulating layer 131 in the Z-direction, such that the first insulating layer 131 may not be deformed or collapsed when removing the second insulating layers 132. After the replacement of a portion of the second insulating layers with a plurality of conductive layers 133, a multi-layered stack 130' is formed. The multi-layered stack 130' includes a plurality of first insulating layers 131 and a plurality of conductive layers 133 arranged alternately. The multi-layered stack 130' is in the array area AA and a portion of the staircase area AS.

Reference is made to FIG. 1 and FIGS. 11A-11D. In the operation 18 of FIG. 1, a first slit structure 500 and a second slit structure 510 is formed in the first slit S1 and the second slit S2. The first slit structure 500 and the second slit structure 510 collectively separate the vertical channel pillars 200 in the Y-direction. The first slit structure 500 and the second slit structure 510 may respectively include a dielectric layer and a conductive structure.

Figure 11A:
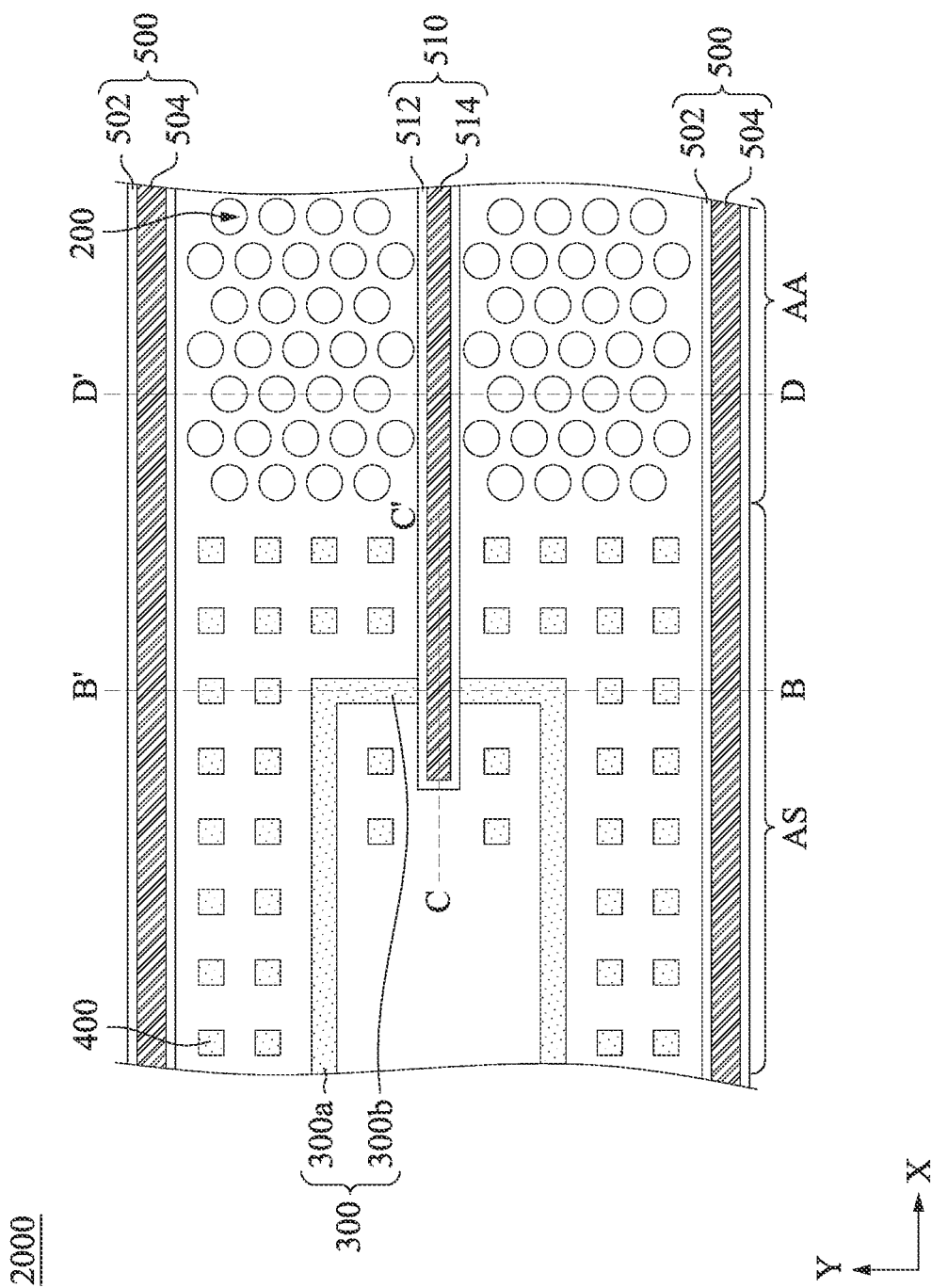
FIG. 11A to FIG. 11D show one of the various stages of manufacturing a three-dimensional memory device in accordance with some embodiments of the present disclosure.
Figure 11B:
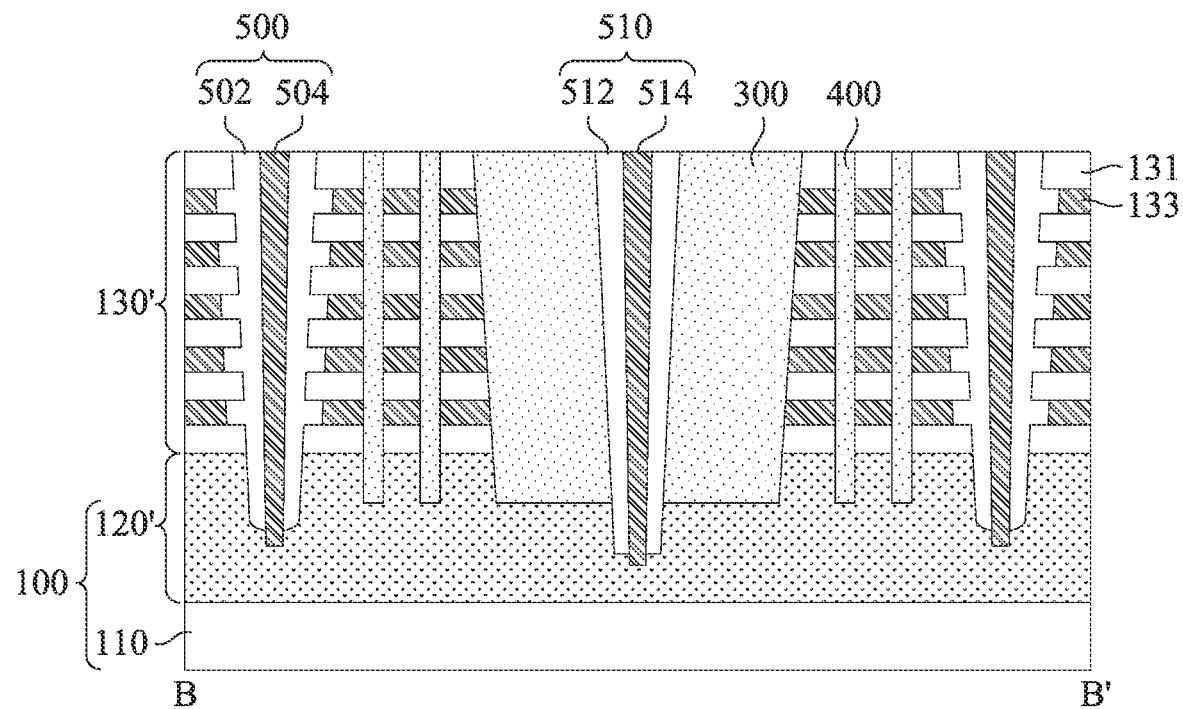
Figure 11B:
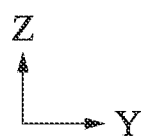

As shown in FIG. 11B, the first dielectric layer 502 is formed on the sidewall of the conductive layers 133 and the sidewall of the first insulating layers 131 in the first slit S1. The first conductive structure 504 is surrounded by the first dielectric layer 502 and in contact with the upper portion 120' of the substrate 100. The second dielectric layer 512 is formed on the sidewall of the conductive layers 133 and the sidewall of the first insulating layers 131 in the second slit S2. The second conductive structure 514 is surrounded by the second dielectric layer 512 and in contact with the upper portion 120' of the substrate 100. The first dielectric layer 502 and the second dielectric layer 512 respectively separate the conductive layers 133 from the first conductive structure 504 and the second conductive structure 514. In some embodiments, the first dielectric layer 502 and the second dielectric layer 512 include dielectric material including, but not limited to, silicon oxide, silicon nitride, silicon oxynitride, or a combination of thereof. In some embodiments, the first conductive structure 504 and the second conductive structure 514 include conductive materials including, but not limited to, tungsten (W), cobalt (Co), copper (Cu), aluminum (Al), polycrystalline silicon (polysilicon), doped silicon, or a combination thereof.

Figure 11C:
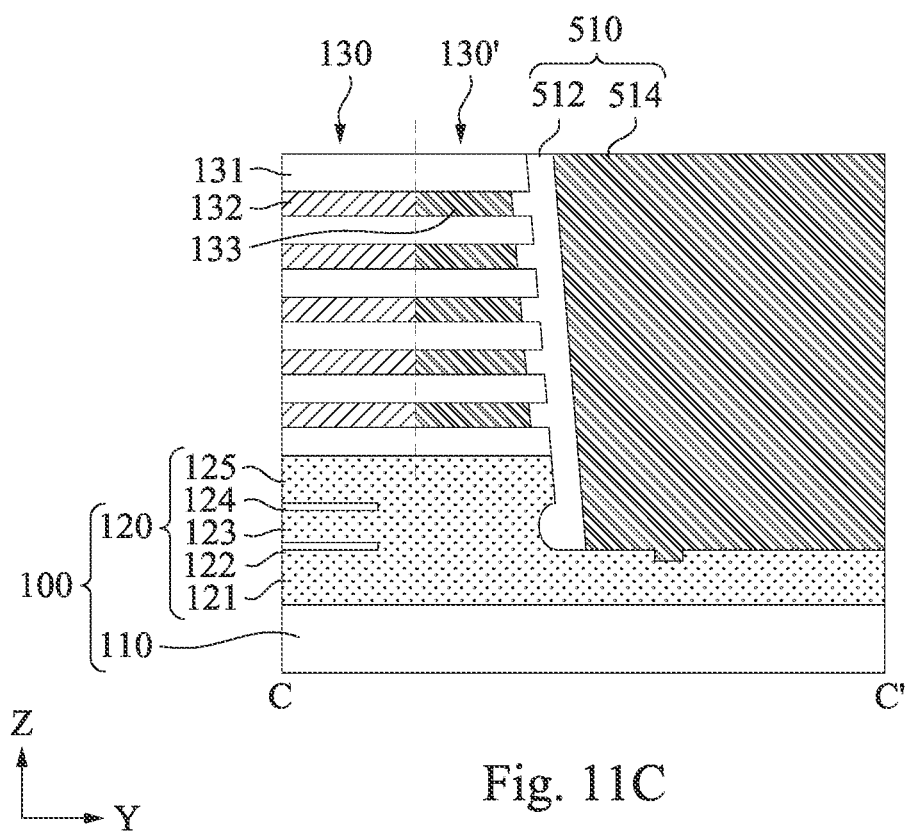
Figure 11D:
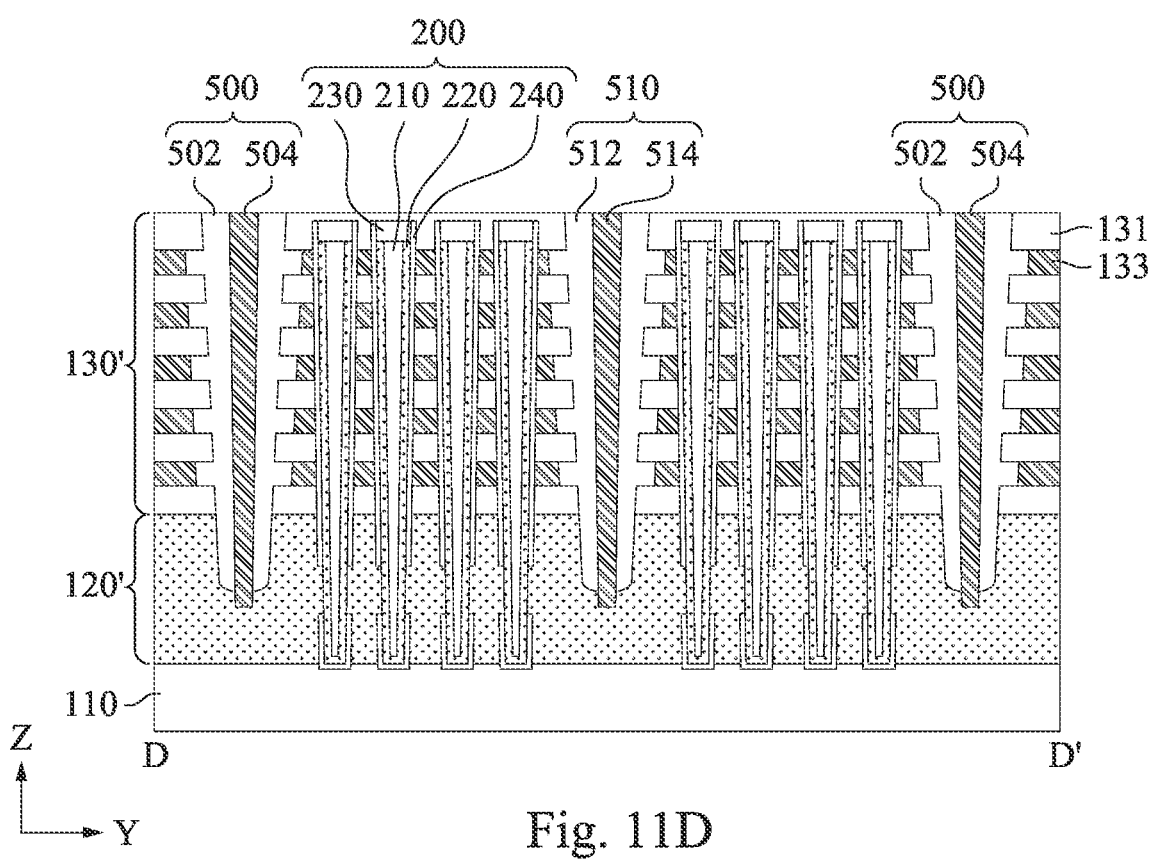

As such, the three-dimensional memory device 2000 is formed. The three-dimensional memory device 2000 includes the substrate 100, multi-layered stack 130', the plurality of vertical channel pillars 200, the barrier structure 300, the first slit structure 500 and the second slit structure 510. The substrate 100 includes an array area AA and a staircase area AS. The multi-layered stack 130' including the first insulating layers 131 and the conductive layers 133 arranged alternately is disposed on the substrate 100. Another multi-layered stack 130 is disposed in the staircase area AS and surrounded by the barrier structure 300. As shown in FIG. 11C, the multi-layered stack 130 is disposed on the substrate 100. The multi-layered stack 130 includes a plurality of first insulating layers 131 and second insulating layers 132 arranged alternately. The second insulating layers 132 are connected to the conductive layers 133.

The vertical channel pillars 200 are disposed in the multi-layered stack 130' and the array area AA of the substrate 100. Each of the vertical channel pillars 200 includes an insulating pillar 210, a channel layer 220, a conductive plug 230 and a charge trapping layer 240. The insulating pillar 210 vertically penetrates the multi-layered stack 130' and extends into the upper portion 120' of the substrate 100. The channel layer 220 surrounds the insulating pillar 210. The conductive plug 230 is disposed on the insulating pillar 210 and the channel layer 220. The charge trapping layer 240 is disposed between the channel layer 220 and the multi-layered stack 130', wherein the charge trapping layer 240 has an opening exposing a portion of a sidewall of the channel layer 220 in the upper portion 120' of the substrate 100 in the array area AA.

The barrier structure 300 is disposed in the multi-layered stack 130' and the staircase area AS of the substrate 100. The barrier structure 300 includes a first portion 300a extending along the X-direction and a second portion 300b extending along the Y-direction and in contact with the first portion 300a. The first slit structure 500 and the second slit structure 510 are disposed in the multi-layered stack 130' along the X-direction. The second slit structure 510 is in contact with the second portion 300b of the barrier structure 300. The first slit structure 500 and the second slit structure 510 collectively separate the vertical channel pillars 200 in the Y-direction. Specifically, the first slit structure 500, the second slit structure 510 and the barrier structure 300 extending in the X-direction can divide the three-dimensional memory device 2000 into multiple portions. The first slit structure 500 and the second slit structure 510 may be functioned as a source contact.

The three-dimensional memory device 2000 further includes a plurality of dielectric pillars 400 disposed in the multi-layered stack 130' and the staircase area AS of the substrate 100. As shown in FIG. 11A, a portion of the dielectric pillars 400 is surrounded by the barrier structure 300. In some embodiments, the three-dimensional memory device 2000 further includes a plurality of contacts (not shown) in the staircase area AS. The contacts may penetrate the multi-layered stack 130 and electrically connect to the transistors and/or the interconnect structures disposed in the substrate 100. In some embodiments, the contacts are surrounded by the barrier structure 300.

As described above, according to the embodiments of the present disclosure, a three-dimensional memory device and a method of manufacturing thereof are provided. The three-dimensional memory device includes a substrate, a multi-layered stack disposed on the substrate, and a plurality of vertical channel pillars, a barrier structure, and a first slit structure and a second slit structure disposed in the multi-layered stack. The first slit structure and the second slit structure respectively extends along a first direction, and the second slit structure is in contact with the barrier structure. The barrier structure surrounds a region in a staircase area. The multi-layered stack includes a plurality of conductive layers and a plurality of first insulating layers stacked alternately. The multi-layered stack further includes a plurality of first insulating layers and a plurality of second insulating layers stacked alternately in the region surrounded by the barrier structure, and each of the second insulating layers connects each of the conductive layers.

In the manufacturing of the three-dimensional memory device, the second insulating layers are replaced by the conductive layers. Since the barrier structure can prevent the etching of the second insulating layers, the second insulating layers surrounded by the barrier structure may not be replaced. The first slit structure, the second slit structure and the barrier structure can divide the three-dimensional memory device into multiple portions, and collectively separate the vertical channel pillars in a second direction that is different from the first direction. The barrier structure may further support the multi-layered stack when performing the replacing process to prevent the deformation or collapse of the multi-layered stack.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A three-dimensional memory device, comprising:
   a substrate having an array area and a staircase area, wherein the substrate comprises a lower portion and an upper portion;
   a first multi-layered stack disposed on the substrate, wherein the first multi-layered stack comprises a plurality of first insulating layers and a plurality of conductive layers arranged alternately;
   a plurality of vertical channel pillars disposed in the first multi-layered stack and the array area of the substrate;
   a barrier structure disposed in the first multi-layered stack and the staircase area of the substrate, wherein the barrier structure penetrates the first multi-layered stack and extends into the upper portion of the substrate; and
   a first slit structure and a second slit structure disposed in the first multi-layered stack and the substrate along a first direction, wherein the second slit structure is in contact with the barrier structure, and the first slit structure and the second slit structure collectively separate the vertical channel pillars in a second direction that is different from the first direction.

2. The three-dimensional memory device of claim 1, wherein each of the conductive layers has a sidewall recessed from sidewalls of the first insulating layers adjacent thereof.

3. The three-dimensional memory device of claim 1, wherein the barrier structure comprises a first portion extending along the first direction and a second portion in contact with the second slit structure and extending along the second direction.

4. The three-dimensional memory device of claim 3, wherein the first portion of the barrier structure has a plurality of segments spaced apart from each other.

5. The three-dimensional memory device of claim 1, wherein the first slit structure and the second slit structure extend from the array area to the staircase area.

6. The three-dimensional memory device of claim 1, wherein the first slit structure and the second slit structure respectively comprises:
   a dielectric layer on a sidewall of the conductive layers and a sidewall of the first insulating layers; and
   a conductive structure surrounded by the dielectric layer and in contact with the upper portion of the substrate.

7. The three-dimensional memory device of claim 1, further comprising a second multi-layered stack on the substrate and surrounded by the barrier structure, wherein the second multi-layered stack comprises the plurality of first insulating layers and a plurality of second insulating layers arranged alternately, wherein the plurality of second insulating layers are connected to the conductive layers.

8. The three-dimensional memory device of claim 1, further comprising a plurality of dielectric pillars disposed in the first multi-layered stack and the staircase area of the substrate.

9. The three-dimensional memory device of claim 8, wherein a portion of the dielectric pillars is surrounded by the barrier structure.

* * * * *